United States Patent
Lin et al.

(10) Patent No.: US 11,094,554 B2
(45) Date of Patent: Aug. 17, 2021

(54) POLISHING PROCESS FOR FORMING SEMICONDUCTOR DEVICE STRUCTURE

(71) Applicant: Taiwan Semiconductor Manufacturing Co., Ltd., Hsinchu (TW)

(72) Inventors: Shih-Ho Lin, Zhubei (TW); Jen-Chieh Lai, Tainan (TW); Jheng-Si Su, Zhubei (TW); Zhi-Sheng Hsu, Zhubei (TW); Po-Ting Huang, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/475,280

(22) Filed: Mar. 31, 2017

(65) Prior Publication Data

US 2018/0286699 A1 Oct. 4, 2018

(51) Int. Cl.
| | |
|---|---|
| *H01L 21/321* | (2006.01) |
| *H01L 21/28* | (2006.01) |
| *B24B 37/04* | (2012.01) |
| *B24B 53/017* | (2012.01) |

(52) U.S. Cl.
CPC ........ *H01L 21/3212* (2013.01); *B24B 37/044* (2013.01); *B24B 53/017* (2013.01)

(58) Field of Classification Search
CPC ........... H01L 21/3212; H01L 21/28123; B24B 53/017; B24B 37/044
See application file for complete search history.

(56) References Cited

U.S. PATENT DOCUMENTS

| | | | |
|---|---|---|---|
| 6,190,236 B1* | 2/2001 | Drill | B24B 37/26 451/285 |
| 6,908,862 B2 | 6/2005 | Li et al. | |
| 2004/0084414 A1* | 5/2004 | Sakai | C09G 1/02 216/88 |
| 2004/0229461 A1* | 11/2004 | Darsillo | C23F 3/06 438/689 |

(Continued)

OTHER PUBLICATIONS

S. Wolf (Silicon Processing for the VLSI Era, vol. 4—Deep Submicron Process Technology, Lattice Press, 2002)(pp. 352-354).*

(Continued)

*Primary Examiner* — Duy Vu N Deo
*Assistant Examiner* — Mahmoud Dahimene
(74) *Attorney, Agent, or Firm* — McClure, Qualey & Rodack, LLP

(57) ABSTRACT

A method for forming a semiconductor device structure is provided. The method includes providing a wafer over a polishing platen. The wafer includes a metal layer and a dielectric layer. The metal layer covers the dielectric layer and fills an opening of the dielectric layer. The method also includes polishing the wafer using a first operation to thin down the metal layer. The first operation has a first polishing selectivity of the metal layer to the dielectric layer. The method further includes polishing the wafer using a second operation to further thin down the metal layer until the dielectric layer is exposed. The second operation has a second polishing selectivity of the metal layer to the dielectric layer. The second polishing selectivity is different from the first polishing selectivity. The first operation and the second operation are performed in-situ on the polishing platen.

20 Claims, 16 Drawing Sheets

(56) References Cited

U.S. PATENT DOCUMENTS

| 2006/0030155 A1* | 2/2006 | Kim | C09G 1/02 |
| | | | 438/691 |
| 2006/0286805 A1* | 12/2006 | Hsu | H01L 21/3212 |
| | | | 438/689 |
| 2009/0057264 A1* | 3/2009 | Mai | B24B 37/042 |
| | | | 216/13 |
| 2014/0323017 A1* | 10/2014 | Tang | B24B 53/017 |
| | | | 451/56 |
| 2015/0314417 A1* | 11/2015 | Sun | B24B 55/06 |
| | | | 451/56 |

OTHER PUBLICATIONS

S. Wolf, Silicon Processing for the VLSI Era, vol. 4—Deep Submicron Process Technology, Lattice Press, 2002 (pp. 352-354) (Year: 2002).*
S. Wolf, Silicon Processing for the VLSI Era, vol. 4—Deep Submicron Process Technology, Lattice Press, 2002 (pp. 392-394) (Year: 2002).*
S. Wolf, Silicon Processing for the VLSI Era, vol. 4—Deep Submicron Process Technology, Lattice Press, 2002.(pp. 335-339) (Year: 2002).*
S. Wolf, Silicon Processing for the VLSI Era, vol. 4—Deep Submicron Process Technology, Lattice Press, 2002)(pp. 349-352) Used Only as Evidence (Year: 2002).*
S. Wolf, Silicon Processing for the VLSI Era, vol. 4—Deep Submicron Process Technology, Lattice Press, 2002 (pp. 417-418) (Year: 2002).*

* cited by examiner

POLISHING PROCESS FOR FORMING SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

In recent decades, chemical mechanical polishing (CMP) processes have been used to planarize layers to build up ICs, thereby helping to provide more precisely structured device features on ICs. A CMP process is a planarization process that combines chemical removal with mechanical polishing. The CMP polishes and removes materials from the wafer, and works on surfaces of different materials.

However, these advances have increased the complexity of processing and manufacturing ICs. Since feature sizes continue to decrease, fabrication processes including the CMP processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
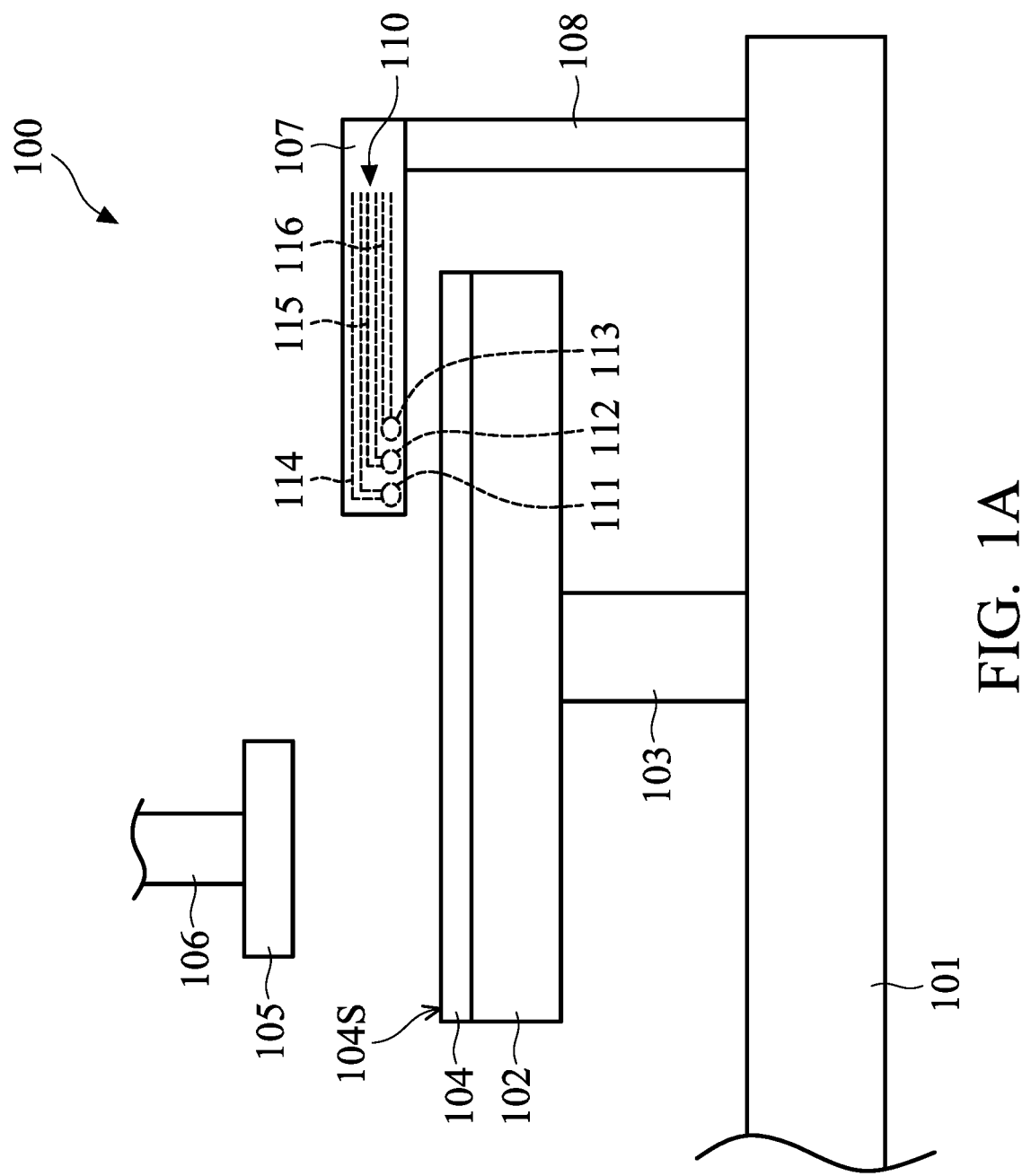
FIG. 1A is a cross-sectional view of an apparatus for performing a polishing process, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
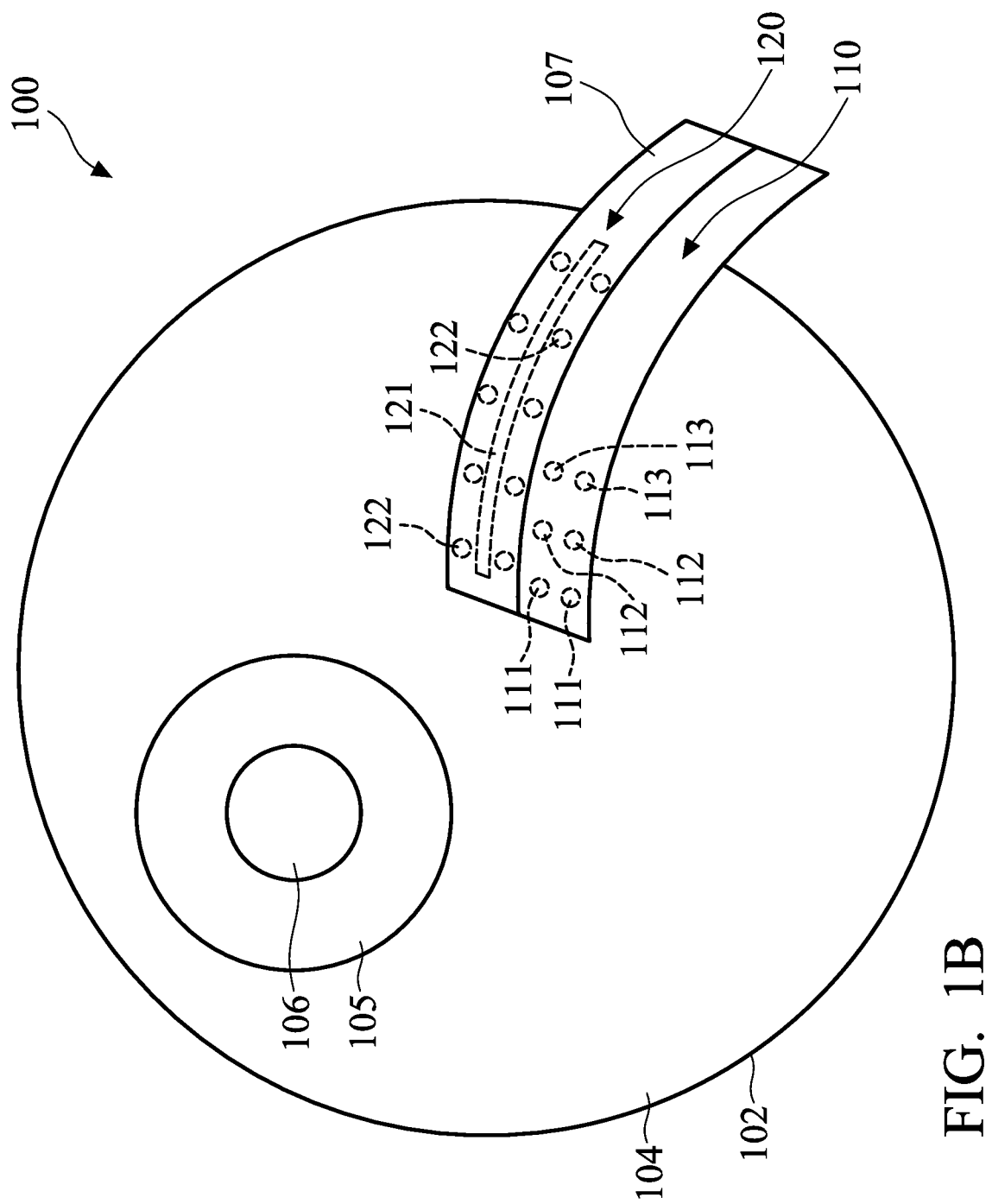
FIG. 1B is a top view of an apparatus for performing a polishing process, in accordance with some embodiments.

FIG. 1A is a cross-sectional view of an apparatus for performing a polishing process, in accordance with some embodiments. FIG. 1B is a top view of an apparatus for performing a polishing process, in accordance with some embodiments. In some embodiments, FIG. 1A shows a cross-sectional view of an apparatus 100, and FIG. 1B shows a top view of the apparatus 100. Some features of the apparatus 100 are not shown in FIG. 1B for a better understanding of the structure. The apparatus 100 is used to perform a polishing process, such as a chemical mechanical polishing (CMP) process or another applicable process.

As shown in FIG. 1A, the apparatus 100 includes a base 101. A polishing platen 102 is supported by a rotating shaft 103 and is coupled to the base 101 through the rotating shaft 103. The rotating shaft 103 is driven by a motor (not shown) to rotate the polishing platen 102 with respect to the base 101 during a polishing process. The apparatus 100 may include more than one polishing platen 102.

A polishing pad 104 is attached to the top surface of the polishing platen 102. The polishing pad 104 provides a wetted polishing surface during a polishing process. The polishing pad 104 will rotate along with the polishing platen 102 by the rotating shaft 103. In some embodiments, the polishing pad 104 is a hard pad, an incompressible pad, a soft pad, another suitable pad material, or a combination thereof. A hard and stiffer pad may be used to achieve planarity. A softer pad may be used to achieve better uniformity and smooth surface. For example, the polishing pad 104 may be a stacked pad including hard and soft pads.

As shown in FIGS. 1A and 1B, a polishing head 105 is coupled to a rotating shaft 106. The rotating shaft 106 is driven by a motor (not shown) to rotate the polishing head 105 with respect to the base 101 during a polishing process. The polishing head 105 is configured to hold a substrate to be polished and apply pressure to the substrate against the polishing pad 104 during a polishing process. The substrate to be polished will be in contact with a wetted polishing surface of the polishing pad 104 during a polishing process. The polishing head 105 may also be referred to as a carrier holder. The apparatus 100 may include more than one polishing head 105.

As shown in FIGS. 1A and 1B, the apparatus 100 further includes a slurry arm 107, in accordance with some embodiments. The slurry arm 107 is coupled to the base 101 through a supporting shaft 108. The slurry arm 107 may be fixed to the supporting shaft 108. Alternatively, the slurry arm 107 may be movable with respect to the supporting shaft 108. The slurry arm 107 may also be referred to as a momentum arm.

Although FIG. 1B shows that the top-view profile of the slurry arm 107 is arc-shaped or curved, embodiments of the disclosure are not limited thereto. In some other embodiments, the top-view profile of the slurry arm 107 is straight or another shape.

As shown in FIGS. 1A and 1B, the slurry arm 107 includes a supply assembly 110, in accordance with some embodiments. In some embodiments, the supply assembly 110 includes multiple dispensing nozzles (or outlets) 111, 112 and 113. The dispensing nozzles 111, 112 and 113 are configured to supply slurry onto the polishing pad 104 to provide a wetted polishing surface during a polishing process. The dispensing nozzles 111, 112 and 113 are illustrated as dashed lines for a better understanding of the structure.

In some embodiments, the dispensing nozzles 111, 112 and 113 are arranged in an array. For example, FIG. 1B shows that the dispensing nozzles 111, 112 and 113 are arranged in a 2×3 array (two rows and three columns). More specifically, one dispensing nozzle 111, one dispensing nozzle 112, and one dispensing nozzle 113 are arranged in a row. Two dispensing nozzles 111 are arranged in a first column, two dispensing nozzles 112 are arranged in a second column, and two dispensing nozzles 113 are arranged in a third column.

However, many variations and/or modifications can be made to embodiments of the disclosure. The dispensing nozzles 111, 112 and 113 may have another suitable arrangement. In some other embodiments, the dispensing nozzles 111, 112 and 113 are in a staggered arrangement (not shown). For example, one dispensing nozzle 111 and one dispensing nozzle 112 may be arranged in a first column of a 2×3 array. One dispensing nozzle 113 and one dispensing nozzle 111 may be arranged in a second column of the 2×3 array. One dispensing nozzle 112 and one dispensing nozzle 113 may be arranged in a third column of the 2×3 array. Alternatively, the dispensing nozzles 111, 112 and 113 may be arranged in a 3×3 array or another suitable array. In some other embodiments, the dispensing nozzles 111, 112 and 113 are arranged in a single row or column.

Although FIGS. 1A and 1B show that the dispensing nozzles 111, 112 and 113 are relatively rounded or circular, embodiments of the disclosure are not limited thereto. In some other embodiments, the dispensing nozzles 111, 112 and 113 are rectangular, square, or another shape. The dispensing nozzles 111, 112 and 113 may have the same shape or different shapes. The dispensing nozzles 111, 112 and 113 may be substantially perpendicular with the top surface 104S of the polishing pad 104.

As shown in FIG. 1A, the dispensing nozzles 111, 112 and 113 are respectively connected to delivery lines 114, 115 and 116, in accordance with some embodiments. The delivery lines 114, 115 and 116 are illustrated as dashed lines for a better understanding of the structure. The delivery lines 114, 115 and 116 may also be referred to as pipes or channels. The delivery lines 114, 115 and 116 are separate and independent from each other. The dispensing nozzles 111, 112 and 113 do not communicate with each other. Accordingly, the different delivery lines 114, 115 and 116 can deliver slurry from different slurry sources. The dispensing nozzles 111, 112 and 113 can supply different slurries onto the polishing pad 104.

Although FIG. 1A shows that the slurry arm 107 includes three independent delivery lines 114, 115 and 116, embodiments of the disclosure are not limited thereto. In some other embodiments, the slurry arm 107 includes two or more than three independent delivery lines. One delivery line 114 may be connected to one or more dispensing nozzles 111. Similarly, one delivery line 115 may be connected to one or more dispensing nozzles 112, and one delivery line 116 may be connected to one or more dispensing nozzles 113.

As shown in FIG. 1B, the slurry arm 107 further includes a cleaning assembly 120 beside the supply assembly 110, in accordance with some embodiments. The cleaning assembly 120 is configured to remove waste slurry and/or recycle slurry left on the polishing pad 104 after the dispensing nozzles 111, 112 and 113 are turned off. Any residue (such as contaminants and/or by-products) left on the polishing pad 104 is also removed by the cleaning assembly 120. In other words, the slurry arm 107 has a self-clean function.

In some embodiments, the cleaning assembly 120 includes an opening (or inlet) 121, which is illustrated as dashed lines. The opening 121 faces the polishing pad 104 and is close to the top surface 104S of the polishing pad 104. Any slurry on the polishing pad 104 will be sucked into the cleaning assembly 120 through the opening 121. The opening 121 may be connected to a suction tube and a suction pump (not shown). For example, the suction pump may be a vacuum pump or another suitable pump. Accordingly, the cleaning assembly 120 may also be referred to as a vacuum suction assembly. The opening 121 may be further connected to a waste tank or a recycle tank (not shown). Slurries and/or other residues left on the polishing pad 104 will be sucked by the cleaning assembly 120 and then delivered to the waste tank or the recycle tank.

Although FIG. 1B shows that the cleaning assembly 120 includes one opening 121, embodiments of the disclosure are not limited thereto. In some other embodiments, the cleaning assembly 120 includes more than one opening 121. Many variations and/or modifications can be made to embodiments of the disclosure. The opening 121 may be divided into multiple segments (not shown).

Although FIG. 1B shows that the top-view profile of the opening 121 is arc-shaped or curved, embodiments of the disclosure are not limited thereto. In some other embodiments, the top-view profile of the opening 121 is straight or another shape. The opening 121 may be relatively rounded, circular, rectangular, square, or another shape. For example, the opening 121 may be a ring-shaped opening.

As shown in FIG. 1B, the cleaning assembly 120 further includes multiple spray nozzles 122, in accordance with some embodiments. The spray nozzles 122 are illustrated as dashed lines for a better understanding of the structure. The spray nozzles 122 face the polishing pad 104 and are close to the top surface 104S of the polishing pad 104. The spray nozzles 122 are configured to supply a rinsing agent (such as deionized water or another suitable solvent) onto the polishing pad 104 during the removal of slurry. Slurries and/or other residues left on the polishing pad 104 will be mixed with the rinsing agent and be sucked along with the rinsing agent by the cleaning assembly 120. As a result, it becomes easier to cleanly remove waste slurry and/or other residues from the polishing pad 104.

In some embodiments, the spray nozzles 122 are on two opposite sides of the opening 121 and are arranged along the opening 121. The spray nozzles 122 may be substantially perpendicular with the top surface 104S of the polishing pad 104. Alternatively, there may be a tilted angle between the spray nozzles 122 and the top surface 104S of the polishing pad 104. The spray nozzles 122 may be fan-shaped spray nozzles.

FIGS. 2A-2G are cross-sectional views of various stages of a polishing process, in accordance with some embodiments. FIGS. 3A-3D are cross-sectional views of various stages of a process for forming a semiconductor device structure, in accordance with some embodiments. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
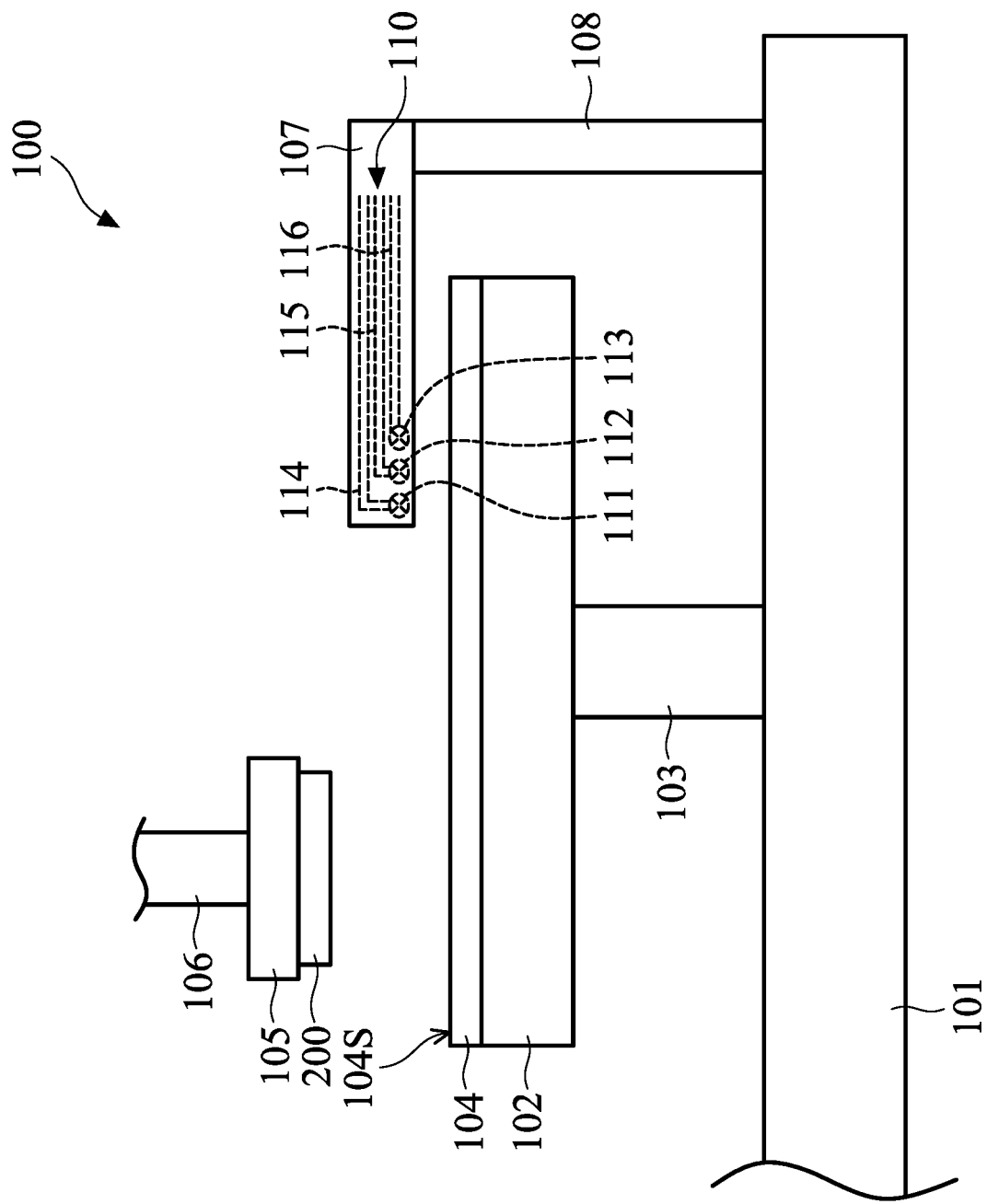
FIGS. 2A-2G are cross-sectional views of various stages of a polishing process, in accordance with some embodiments.
Figure 3A:
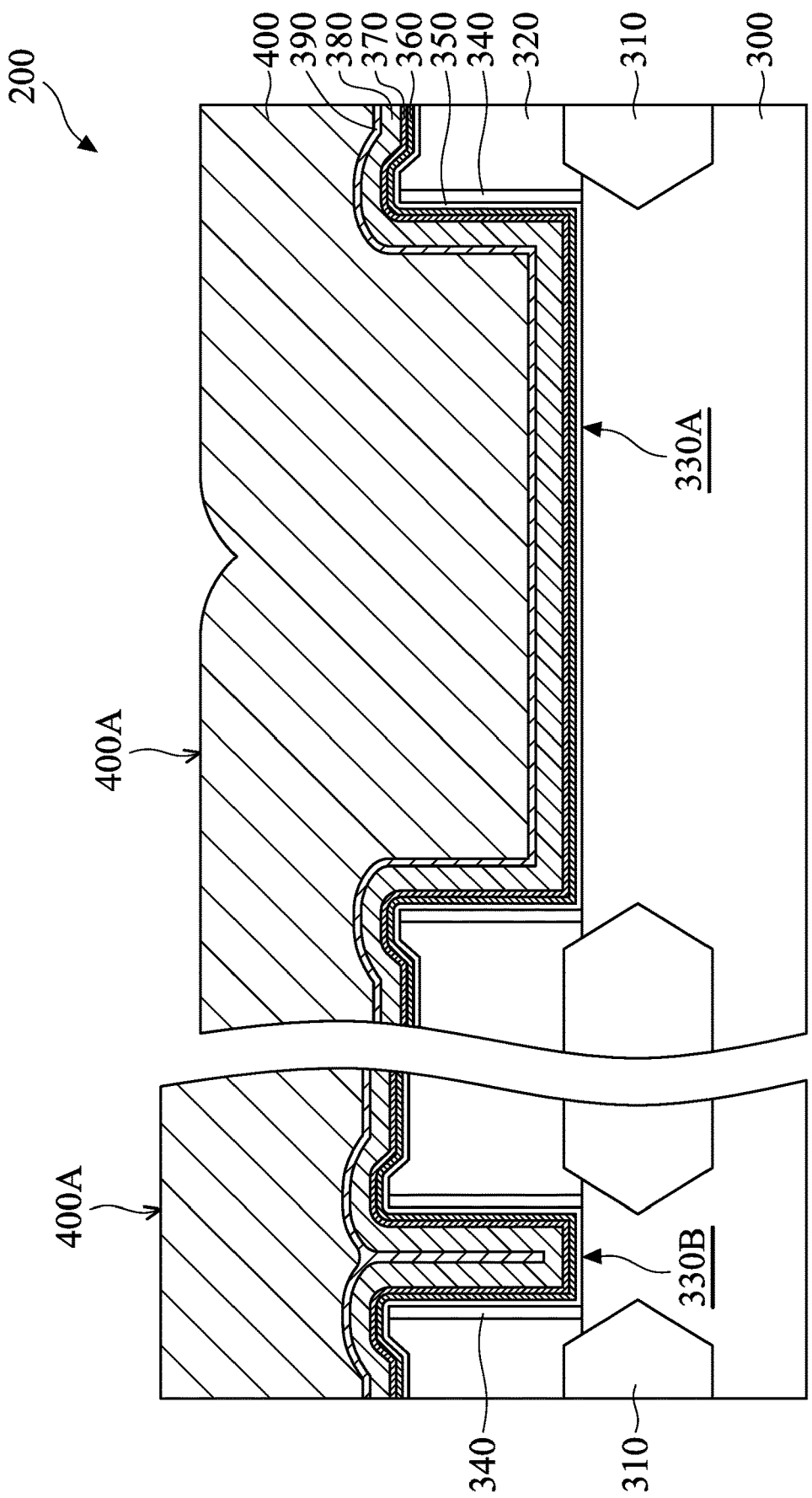
FIGS. 3A-3D are cross-sectional views of various stages of a process for forming a semiconductor device structure, in accordance with some embodiments.

As shown in FIG. 2A, a wafer 200 to be polished is transferred into the apparatus 100, in accordance with some embodiments. The wafer 200 is held by the polishing head 105. Referring to FIG. 3A, it shows the detailed structure of the wafer 200 as an example, but embodiments of the disclosure are not limited thereto. The wafer 200 is formed using front-end-of-line (FEOL) semiconductor fabrication processes. FEOL semiconductor fabrication processes include deposition, etching, implantation, photolithography, annealing, planarization, another applicable process, and combinations thereof. In some embodiments, the wafer 200 includes a semiconductor substrate 300, source/drain features 310, a interlayer dielectric (ILD) layer 320, spacer elements 340, a gate dielectric layer 350, and multiple gate stacking layers (which will be described in more detail later).

The semiconductor substrate 300 is a semiconductor wafer. In some embodiments, the semiconductor substrate 300 includes silicon or other elementary semiconductor materials such as germanium. In some other embodiments, the semiconductor substrate 300 includes a compound semiconductor. The compound semiconductor may include silicon carbide, gallium arsenide, indium arsenide, indium phosphide, another suitable compound semiconductor, or a combination thereof. In some embodiments, the semiconductor substrate 300 includes a semiconductor-on-insulator (SOI) substrate. The SOI substrate may be fabricated using a separation by implantation of oxygen (SIMOX) process, a wafer bonding process, another applicable method, or a combination thereof.

As shown in FIG. 3A, source/drain features 310 are in and/or over the semiconductor substrate 300. The source/drain features 310 may be used to provide stress or strain to channel regions in the semiconductor substrate 300 below metal gate stacks, which will be described in more detail later. In some embodiments, some portions of the semiconductor substrate 300 are recessed using an etching process. Afterwards, a semiconductor material (such as silicon or silicon germanium) is epitaxially grown over the semiconductor substrate 300 that are recessed to form the source/drain features 310, as shown in FIG. 3A. In some embodiments, the source/drain features 310 are diamond shaped. In some embodiments, the source/drain features 310 are doped with one or more dopants, such as phosphorus (P), arsenic (As), boron (B), or other suitable dopants.

As shown in FIG. 3A, the ILD layer 320 is over the semiconductor substrate 300 and covers the source/drain features 310. In some embodiments, there are an opening 330A and an opening 330B in the ILD layer 320. The openings 330A and 330B are filled with the gate dielectric layer 350 and the gate stacking layers. The spacer elements 340 are between the gate dielectric layer 350 and the ILD layer 320.

More specifically, in some embodiments, sacrificial or dummy gate stacks (not shown) are formed over the semiconductor substrate 300. The sacrificial gate stacks may be polysilicon gate stacks. The spacer elements 340 are formed over sidewalls of the sacrificial gate stacks. The ILD layer 320 is deposited over the semiconductor substrate 300 and surrounds the sacrificial gate stacks and the spacer elements 340. Afterwards, the sacrificial gate stacks are removed so that the openings 330A and 330B are formed in the ILD layer 320. The gate dielectric layer 350 and the gate stacking layers are deposited over the ILD layer 320 and fill up the openings 330A and 330B, as shown in FIG. 3A.

In some embodiments, the ILD layer 320 includes silicon oxide, silicon oxynitride, borosilicate glass (BSG), phosphosilicate glass (PSG), borophosphosilicate glass (BPSG), fluorinated silicate glass (FSG), low-K material, porous dielectric material, another suitable dielectric material, or a combination thereof. The low-K material may have a dielectric constant smaller than that of silicon dioxide. For example, the low-K material has a dielectric constant in a range from about 1.5 to about 3.5. In some embodiments, the spacer elements 340 are made of silicon nitride, silicon oxynitride, silicon carbide, silicon oxycarbide, another suitable material, or a combination thereof. In some embodiments, the gate dielectric layer 350 is a high-K dielectric layer. The high-K dielectric layer may be made of hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

As shown in FIG. 3A, the gate stacking layers include a capping layer (or a barrier layer) 360, a work function layer 370, a blocking layer 380, a glue layer 390, a metal filling layer 400, in accordance with some embodiments. Some of these gate stacking layers can be replaced or eliminated for different embodiments. Additional layers can be added to form the gate stacking layers.

The capping layer 360 is deposited over the ILD layer 320 and in the openings 330A and 330B. The capping layer 360 may be used to interface the gate dielectric layer 350 with the work function layer 370. The capping layer 360 may be referred to as a barrier layer that is used to prevent diffusion between the gate dielectric layer 350 and the work function layer 370. In some embodiments, the capping layer 360 protects the gate dielectric layer 350 during the annealing operation that is used to reduce or eliminate defects in the gate dielectric layer 350. In some embodiments, the capping layer 360 is made of a metal-containing material. The metal-containing material may include titanium nitride, tantalum nitride, another suitable material, or a combination thereof. In some other embodiments, the capping layer 360 has a multi-layer structure. In some other embodiments, the capping layer 360 is not formed.

The work function layer 370 is deposited over the capping layer 360. The work function layer 370 is used to provide the desired work function for transistors to enhance device performance including improved threshold voltage (Vt). In the embodiments of forming an NMOS transistor, the work function layer 370 can be an N-type metal layer. The N-type metal layer is capable of providing a work function value suitable for the device. The work function value may be substantially equal to or less than about 4.5 eV. The N-type metal layer may include metal, metal carbide, metal nitride, or a combination thereof. For example, the N-type metal layer includes titanium nitride, tantalum, tantalum nitride, another suitable material, or a combination thereof.

On the other hand, in the embodiments of forming a PMOS transistor, the work function layer 370 can be a P-type metal layer. The P-type metal layer is capable of providing a work function value suitable for the device. The work function value may be substantially equal to or greater than about 4.8 eV. The P-type metal layer may include metal, metal carbide, metal nitride, other suitable materials, or a combination thereof. For example, the P-type metal includes tantalum nitride, tungsten nitride, titanium, titanium nitride, other suitable materials, or a combination thereof.

The work function layer 370 may also be made of hafnium, zirconium, titanium, tantalum, aluminum, metal carbides (e.g., hafnium carbide, zirconium carbide, titanium carbide, aluminum carbide), metal nitrides, ruthenium, palladium, platinum, cobalt, nickel, conductive metal oxides, or a combination thereof. The thickness and/or the compositions of the work function layer 370 may be fine-tuned to adjust the work function level. For example, a titanium nitride layer may be used as a P-type metal layer or an N-type metal layer, depending on the thickness and/or the compositions of the titanium nitride layer. In some other embodiments, the work function layer 370 has a multi-layer structure.

The blocking layer 380 is deposited over the work function layer 370. The blocking layer 380 may be used to prevent the metal filling layer 400 from diffusing or penetrating into the work function layer 370. In some embodiments, the blocking layer 380 is made of tantalum nitride, titanium nitride, another suitable material, or a combination thereof. In some other embodiments, the blocking layer 380 is not formed.

The glue layer 390 is deposited over the blocking layer 380. The glue layer 390 may be used to increase the adhesion between the work function layer 370 and the metal filling layer 400. As a result, the metal filling layer 400 is prevented from peeling or delamination. In some embodiments, the glue layer 390 is made of tantalum nitride, titanium nitride, another suitable material, or a combination thereof. In some other embodiments, the glue layer 390 is not formed.

The metal filling layer 400 is deposited over the glue layer 390. In some embodiments, the metal filling layer 400 includes tungsten, aluminum, copper, cobalt, another suitable material, or a combination thereof. In some other embodiments, the metal filling layer 400 is not formed.

In some embodiments, the gate dielectric layer 350, the capping layer 360, the work function layer 370, the blocking layer 380, and the glue layer 390 are deposited conformally while the metal filling layer 400 is deposited non-conformally. The gate dielectric layer 350, the capping layer 360, the work function layer 370, the blocking layer 380, the glue layer 390, and the metal filling layer 400 together fill the opening 330A, as shown in FIG. 3A. In some embodiments, the opening 330B is narrower than the opening 330A. The gate dielectric layer 350, the capping layer 360, the work function layer 370, the blocking layer 380, and the glue layer 390 fill up the opening 330B. The metal filling layer 400 may not fill the opening 330B. As a result, the metal filling layer 400 has a relatively high topography over the opening 330B and a relatively low topography over the opening 330A. The metal filling layer 400 has a non-uniform and uneven top surface 400A.

In some embodiments, portions of the gate dielectric layer 350, the capping layer 360, the work function layer 370, the blocking layer 380, the glue layer 390, and the metal filling layer 400 outside of the openings 330A and 330B are removed using a planarization process. The planarization process may include a CMP process, another applicable process, or a combination thereof. As a result, the gate dielectric layer 350, the capping layer 360, the work function layer 370, the blocking layer 380, the glue layer 390, and the metal filling layer 400 remaining in the openings 330A and 330B together form metal gate stacks.

More specifically, in order to form metal gate stacks using a polishing process, the wafer 200 shown in FIG. 3A is transferred into the apparatus 100, as shown in FIG. 2A. In accordance with some embodiments, the polishing process for forming metal gate stacks includes multiple polishing operations. Three polishing operations 210, 220 and 230 will be described as an example, but embodiments of the disclosure are not limited thereto. In some other embodiments, a polishing process includes two or more than three polishing operations to form any suitable structure.

Figure 2B:
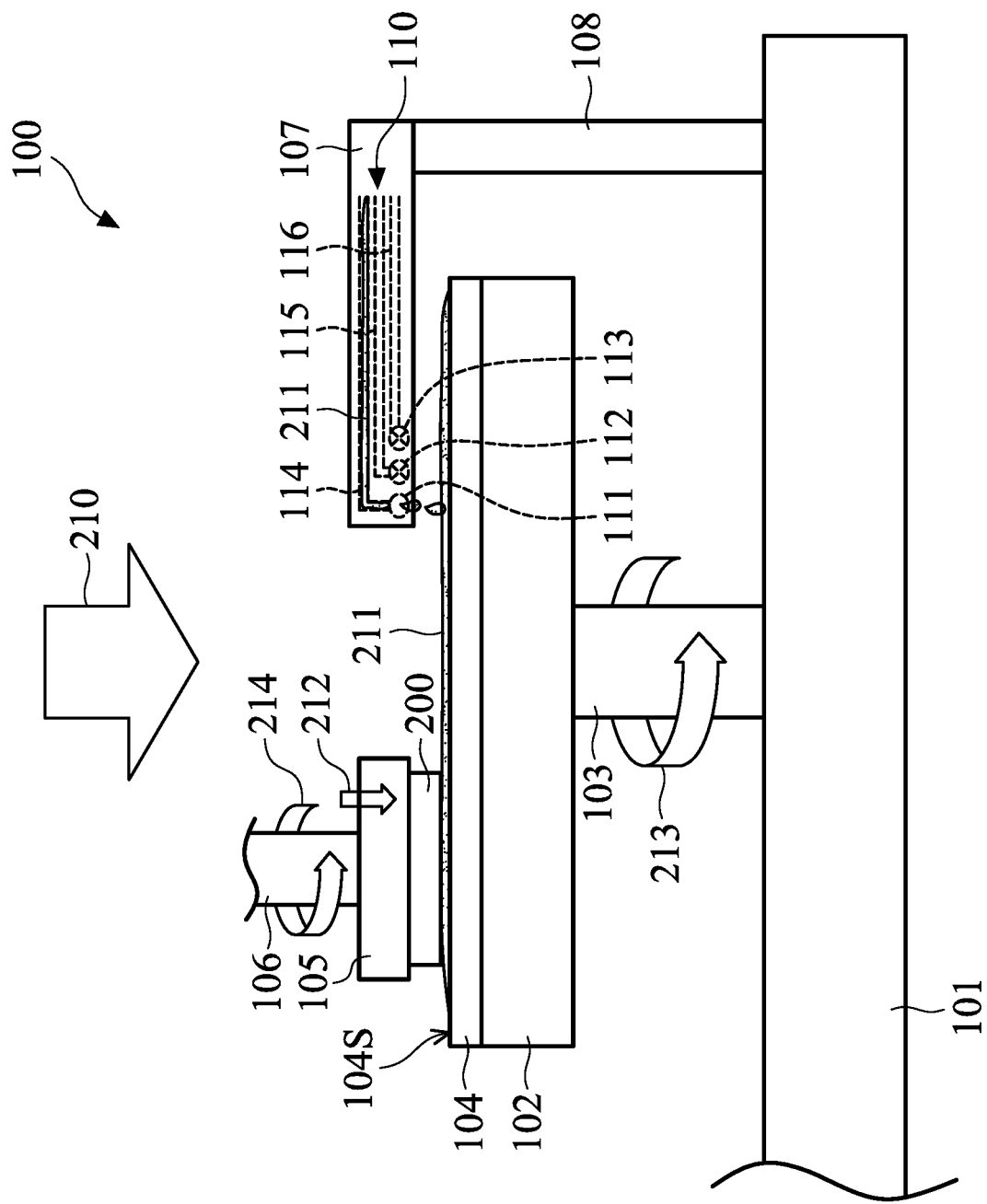

To perform the polishing operation 210, the wafer 200 is carried by the polishing head 105 with the metal filling layer 400 facing the top surface 104S of the polishing pad 104. Afterwards, the rotating shaft 103 is driven to rotate the polishing platen 102 with respect to the base 101, as shown in FIG. 2B. The supply assembly 110 of the slurry arm 107 is then turned on. Slurry 211 begins to flow through the delivery line 114 to the dispensing nozzle 111. The dispensing nozzle 111 continues to supply the slurry 211 onto the top surface 104S of the polishing pad 104. Subsequently, the rotating shaft 106 is driven to rotate the polishing head 105, which holds the wafer 200, as shown in FIG. 2B. The polishing head 105 applies a pressure 212 to the wafer 200, so that the rotating wafer 200 is pressed against the rotating polishing pad 104. As a result, the rotating wafer 200 begins to be polished by the slurry 211 on the top surface 104S of the rotating polishing pad 104. For example, the top surface 400A of the metal filling layer 400 of the wafer 200 may be in direct contact with the slurry 211 and be ground by the slurry 211.

The polishing platen 102 and the polishing pad 104 thereon rotate at a rotation rate 213. The wafer 200 rotates at a rotation rate 214. In some embodiments, the rotation rate 214 is less than the rotation rate 213. However, many variations and/or modifications can be made to embodiments of the disclosure. The rotation rate 214 may be greater than the rotation rate 213. The polishing platen 102 or the polishing pad 104 rotates in a clockwise or counter-clockwise direction. The wafer 200 rotates in a clockwise or counter-clockwise direction. Although FIG. 2B shows that the polishing platen 102 and the wafer 200 rotate in the same direction, embodiments of the disclosure are not limited thereto. The polishing platen 102 and the wafer 200 may rotate in different directions.

In some embodiments, the slurry 211 has a flow rate in a range from about 50 cc/sec. to about 600 cc/sec. The dispensing nozzles 112 and 113 are off during the application of the slurry 211, as shown in FIG. 2B in accordance with some embodiments. No slurry flows or drops to the top surface 104S of the polishing pad 104 from the dispensing nozzles 112 and 113.

In some embodiments, the slurry 211 is a slurry solution which includes a polishing material in water. In some embodiments, the polishing material of the slurry 211 includes $Fe(NO_3)_3$, $H_2O_2$, another suitable polishing material, or a combination thereof. In some embodiments, the polishing material of the slurry 211 further includes abrasives (e.g., polishing agents), additives (e.g., surfactants), or a combination thereof. The abrasives may include $Al_2O_3$ particles, $SiO_2$ particles, other suitable particles or a combination thereof. For example, the slurry 211 may be a slurry solution containing $Al_2O_3$ particles, $Fe(NO_3)_3$ and $H_2O_2$. Alternatively, the slurry 211 may be a slurry solution containing $SiO_2$ particles and $H_2O_2$.

In some embodiments, the slurry 211 has a concentration in a range from about 10% to about 30%, such as about 20%. For example, a volume ratio or weight ratio of the polishing material to water may be in a range from about 1:1 to about 1:20. In some embodiments, the slurry 211 has a pH value in a range from about 2 to about 4, but embodiments of the disclosure are not limited thereto. In some embodiments, the slurry 211 has a polishing selectivity of a metal material to a dielectric layer (i.e., a metal material: a dielectric layer) in a range from about 0.5:1 to about 100:1. In some embodiments, the slurry 211 has a polishing selectivity of the metal filling layer 400 to the ILD layer 320 in a range from about 0.5:1 to about 100:1. For example, the slurry 211 may have a polishing selectivity of tungsten (W) to silicon oxide ($SiO_2$) in a range from about 10:1 to about 100:1. Alternatively, the slurry 211 may have a polishing selectivity of W to $SiO_2$ in a range from about 0.5:1 to about 2:1.

Figure 3B:
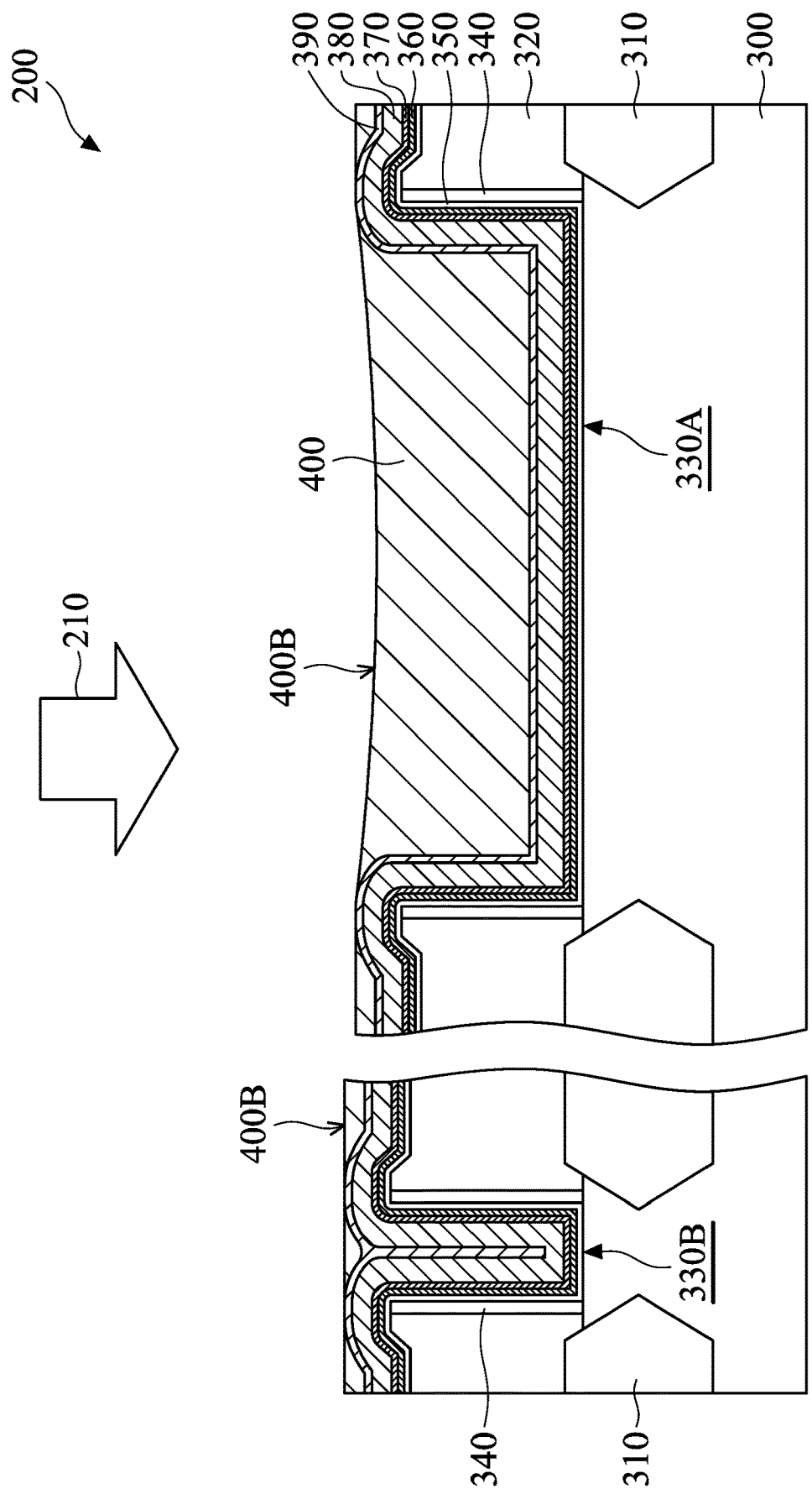

In some embodiments, the slurry 211 has a sufficiently high polishing selectivity of the metal filling layer 400. The sufficiently high polishing selectivity may be greater than about 40:1, but embodiments of the disclosure are not limited thereto. The metal filling layer 400 is polished much faster than the glue layer 390 and/or other layers. As a result, the metal filling layer 400 may be thinned until the glue layer 390 is exposed. The glue layer 390 may function as a stop layer so that the polishing operation 210 may be substantially stopped at the glue layer 390. In some embodiments, the metal filling layer 400 is partially removed and has an uneven and recessed top surface 400B, as shown in FIG. 3B.

Figure 2C:
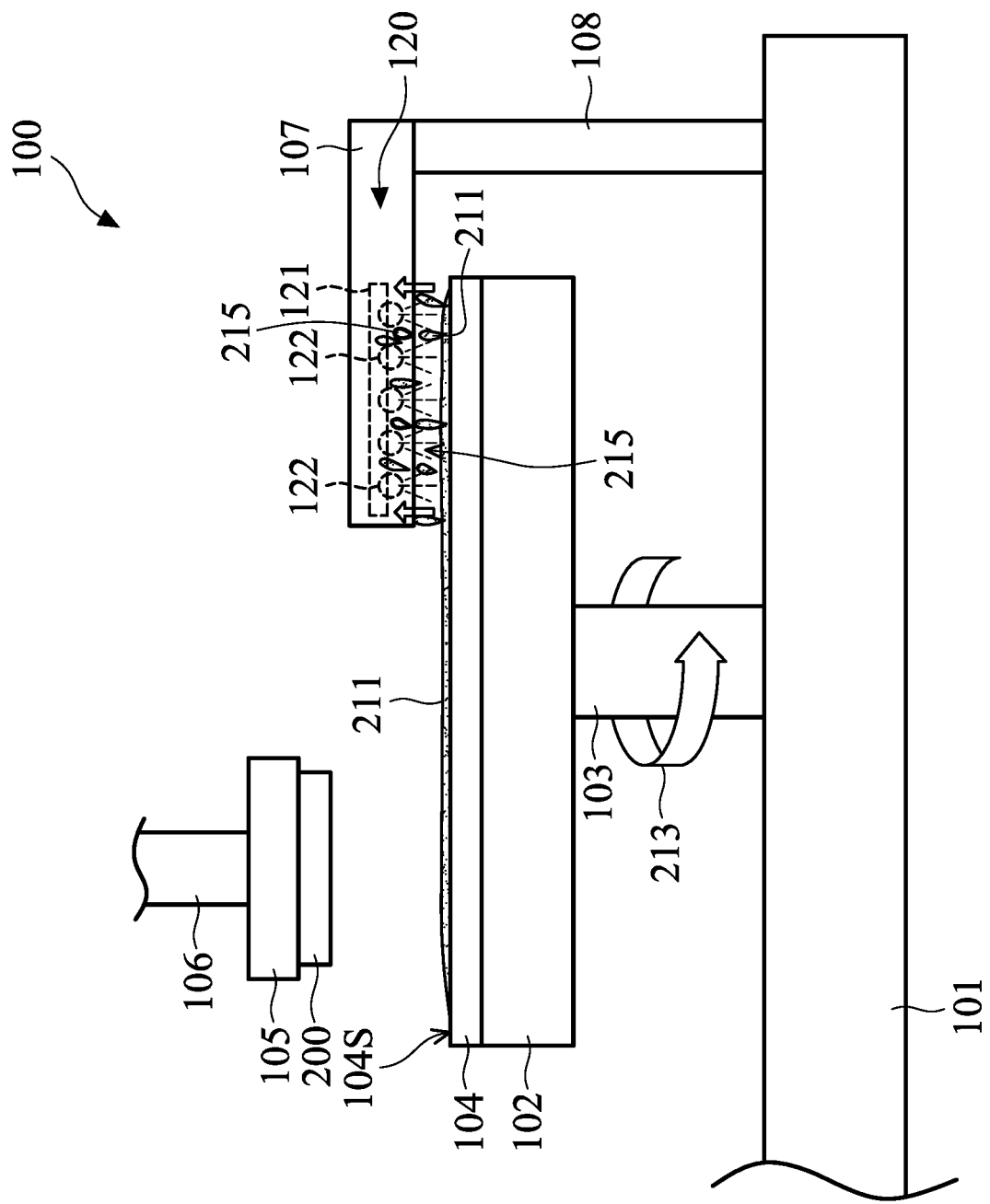

When the initial polishing of the wafer 200 is finished, the supply assembly 110 of the slurry arm 107 is turned off. The dispensing nozzle 111 stops supplying the slurry 211 on the top surface 104S of the polishing pad 104. The polishing platen 102 continues to rotate. Afterwards, the wafer 200 is raised up and away from the rotating polishing pad 104 by the polishing head 105. The wafer 200 stops rotating. Subsequently, the cleaning assembly 120 of the slurry arm 107 is turned on. The excess or waste slurry 211 left on the top surface 104S of the polishing pad 104 begins to be removed or exhausted by the cleaning assembly 120, as shown in FIG. 2C.

More specifically, the spray nozzles 122 of the cleaning assembly 120 spray a rinsing agent 215 onto the polishing pad 104. The slurry 211 and/or other residues left on the polishing pad 104 are mixed with the rinsing agent 215 and are sucked along with the rinsing agent 215 into the cleaning assembly 120 through the opening 121. The slurry 211 and/or other residues may be delivered to a waste tank or a recycle tank by the cleaning assembly 120. The cleaning assembly 120 is turned on until the top surface 104S of the polishing pad 104 becomes clean or dry and has no slurry 211. The polishing platen 102 continues to rotate during the removal of the slurry 211. The slurry arm 107 may or may not be fixed during the removal of the slurry 211.

Figure 4:
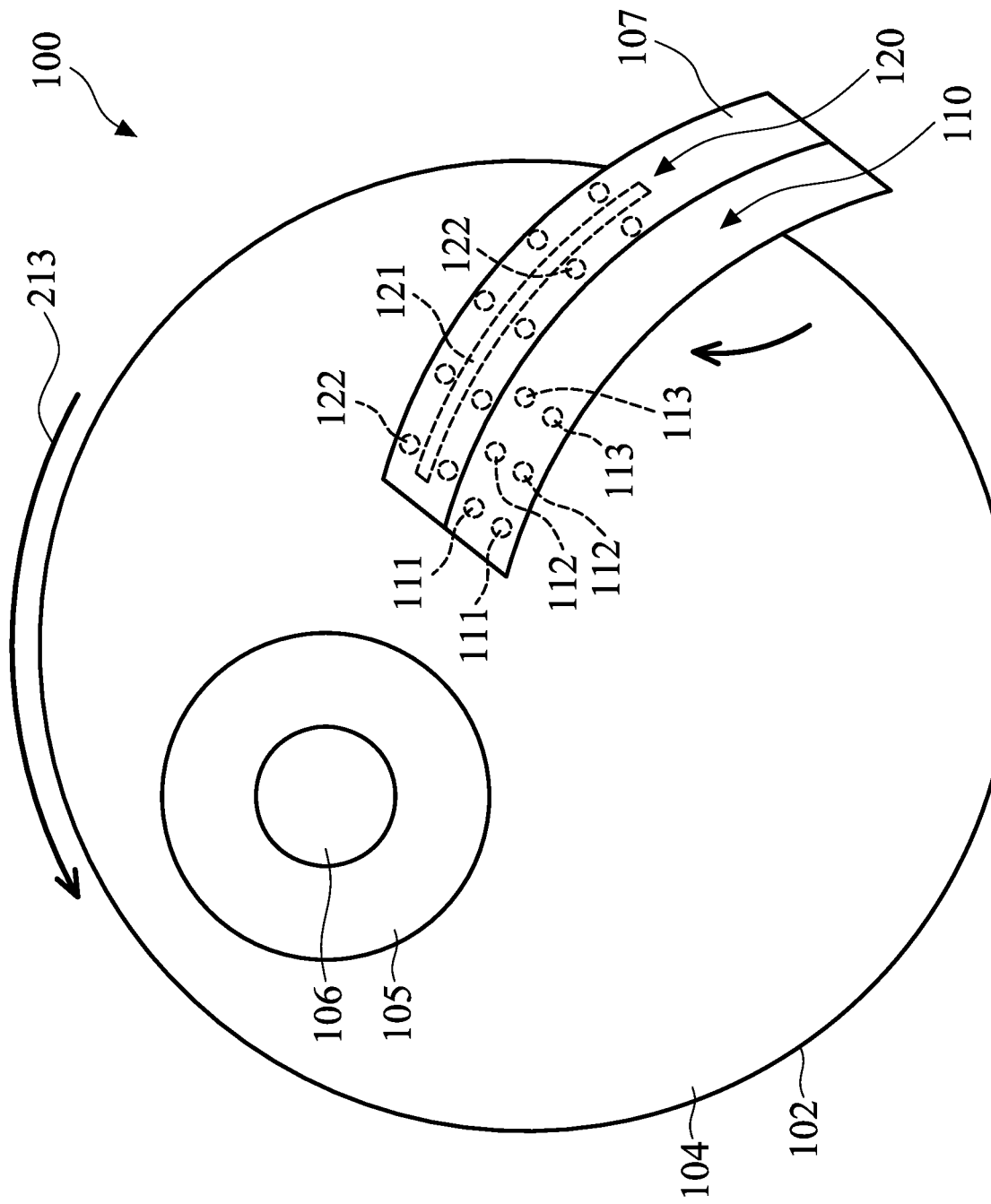
FIG. 4 is a top view of an apparatus of an intermediate stage of a polishing process, in accordance with some embodiments.

In some embodiments, after the removal of the slurry 211, the slurry arm 107 moves with respect to the polishing head 105 to change its position, as shown in FIG. 4. FIG. 4 is a top view of the apparatus 100 of an intermediate stage of a polishing process, in accordance with some embodiments. As a result, other slurry supplied by the supply assembly 110 of the slurry arm 107 can be dispensed at a better position on the top surface 104S of the polishing pad 104. It improves the uniformity of slurry on the top surface 104S of the polishing pad 104. Many variations and/or modifications can be made to embodiments of the disclosure. In some other embodiments, the slurry arm 107 maintains the same position. Good uniformity of slurry on the top surface 104S of the polishing pad 104 may be still achieved.

Figure 2D:
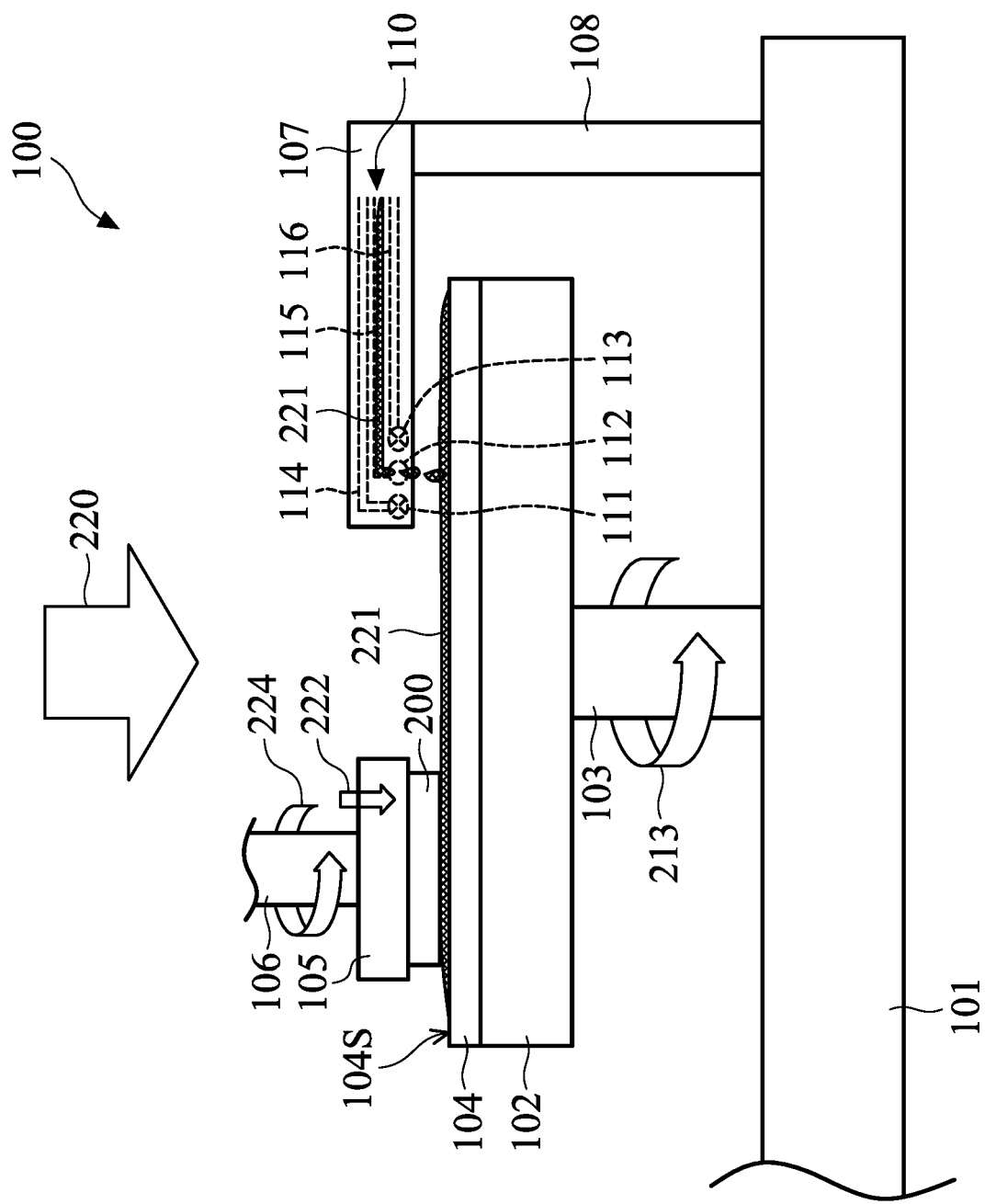
Figure 3C:
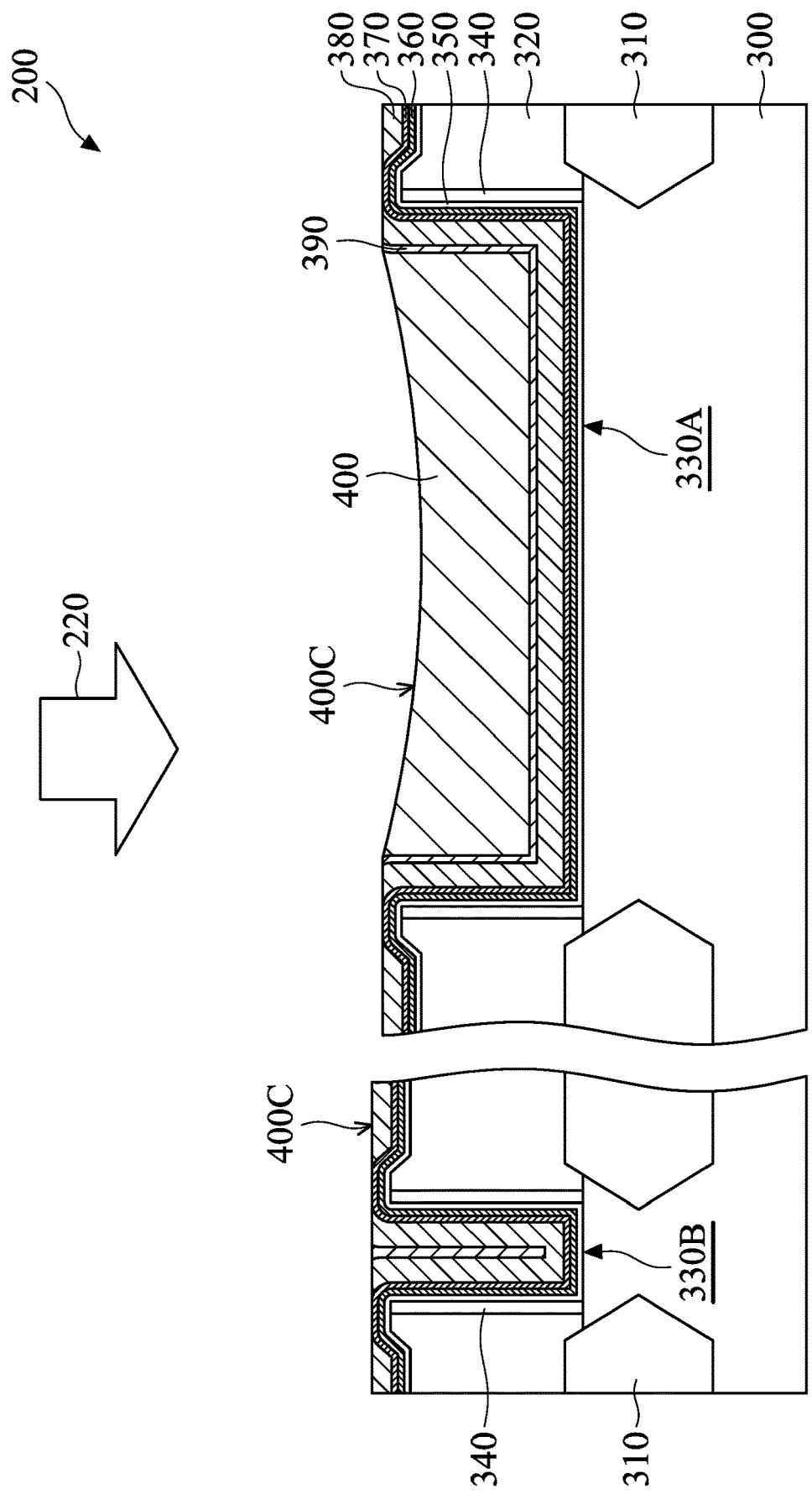

Afterwards, the polishing operation 220 is performed over the same polishing platen 102, as shown in FIG. 2D in accordance with some embodiments. The same polishing pad 104 may be used in the polishing operations 210 and 220. The supply assembly 110 of the slurry arm 107 is turned on. Slurry 221 begins to flow through the delivery line 115 to the dispensing nozzle 112. The dispensing nozzle 112 continues to supply the slurry 221 onto the top surface 104S of the polishing pad 104. Subsequently, the rotating shaft 106 is driven to rotate the wafer 200. The rotating wafer 200 is pressed against the rotating polishing pad 104 by the polishing head 105. As a result, the rotating wafer 200 begins to be polished by the slurry 221 on the top surface 104S of the rotating polishing pad 104. For example, the top surface 400B of the metal filling layer 400 of the wafer 200 may be in direct contact with the slurry 221 and be ground by the slurry 221. One or more layers of the wafer 200 (such as the glue layer 390 and the blocking layer 380) may be also ground by the slurry 221, as shown in FIG. 3C.

The polishing head 105 applies a pressure 222 to the wafer 200, as shown in FIG. 2D. The pressure 222 may be greater than, less than or substantially equal to the pressure 212, which is applied to the wafer 200 during the polishing operation 210. The wafer 200 rotates at a rotation rate 224 during the polishing operation 220. The rotation rate 224 may be greater than the rotation rate 213 of the polishing platen 102, but embodiments of the disclosure are not limited thereto. The rotation rate 224 may be greater than, less than or substantially equal to the rotation rate 214 of the wafer 200 during the polishing operation 210.

In some embodiments, the slurry 221 has a flow rate in a range from about 50 cc/sec. to about 600 cc/sec. The flow rate of the slurry 221 may be greater than, less than or substantially equal to the flow rate of the slurry 211. The dispensing nozzles 111 and 113 are off during the application of the slurry 221, as shown in FIG. 2D in accordance with some embodiments. No slurry flows or drops to the top surface 104S of the polishing pad 104 from the dispensing nozzles 111 and 113.

In some embodiments, the polishing material of the slurry 221 includes $Fe(NO_3)_3$, $H_2O_2$, another suitable polishing material, or a combination thereof. In some embodiments, the polishing material of the slurry 221 further includes abrasives, additives, or a combination thereof. The abrasives may include $Al_2O_3$ particles, $SiO_2$ particles, other suitable particles or a combination thereof. For example, the slurry 221 may be a slurry solution containing $Al_2O_3$ particles, $Fe(NO_3)_3$ and $H_2O_2$ or a slurry solution containing $SiO_2$ particles and $H_2O_2$. In some embodiments, the slurry 221 and the slurry 211 have different compositions. The slurry 221 and the slurry 211 may include different abrasives or the same abrasive.

In some embodiments, the slurry 221 has a concentration in a range from about 10% to about 30%. In some embodiments, the slurry 221 and the slurry 211 have different concentrations. In some embodiments, the slurry 221 has a pH value in a range from about 2 to about 4, but embodiments of the disclosure are not limited thereto. In some embodiments, the slurry 221 and the slurry 211 have different pH values.

In some embodiments, the slurry 221 has a polishing selectivity of a metal material to a dielectric layer in a range from about 0.5:1 to about 100:1. In some embodiments, the slurry 221 has a polishing selectivity of the metal filling layer 400 to the ILD layer 320 in a range from about 0.5:1 to about 100:1. For example, the slurry 221 may have a polishing selectivity of W to $SiO_2$ in a range from about 10:1 to about 100:1 or in a range from about 0.5:1 to about 2:1.

In accordance with some embodiments, the metal filling layer 400 of the wafer 200 is polished at a higher polishing rate during the polishing operation 210 than the polishing operation 220. The polishing rate may be determined by slurry, rotation rates, the applied pressure, etc. For example, the composition, concentration, abrasive, or pH value of slurry may play an important role in the polishing rate. In some embodiments, the slurry 211 has a higher polishing selectivity of a metal material to a dielectric layer than the slurry 221. However, many variations and/or modifications can be made to embodiments of the disclosure. In some other embodiments, the wafer 200 is polished at a lower polishing rate during the polishing operation 210 than the polishing operation 220. The slurry 211 may have a lower polishing selectivity of a metal material to a dielectric layer than the slurry 221.

In some embodiments, the slurry 221 has a relatively high polishing selectivity of the metal filling layer 400. The relatively high polishing selectivity may be greater than about 40:1, but embodiments of the disclosure are not limited thereto. The metal filling layer 400 is polished faster than the glue layer 390 and/or other layers covered by the glue layer 390. In some embodiments, the metal filling layer 400, the glue layer 390 and/or the blocking layer 380 are partially removed during the polishing operation 220. In some embodiments, the metal filling layer 400 has an uneven and recessed top surface 400C, as shown in FIG. 3C.

Figure 2E:
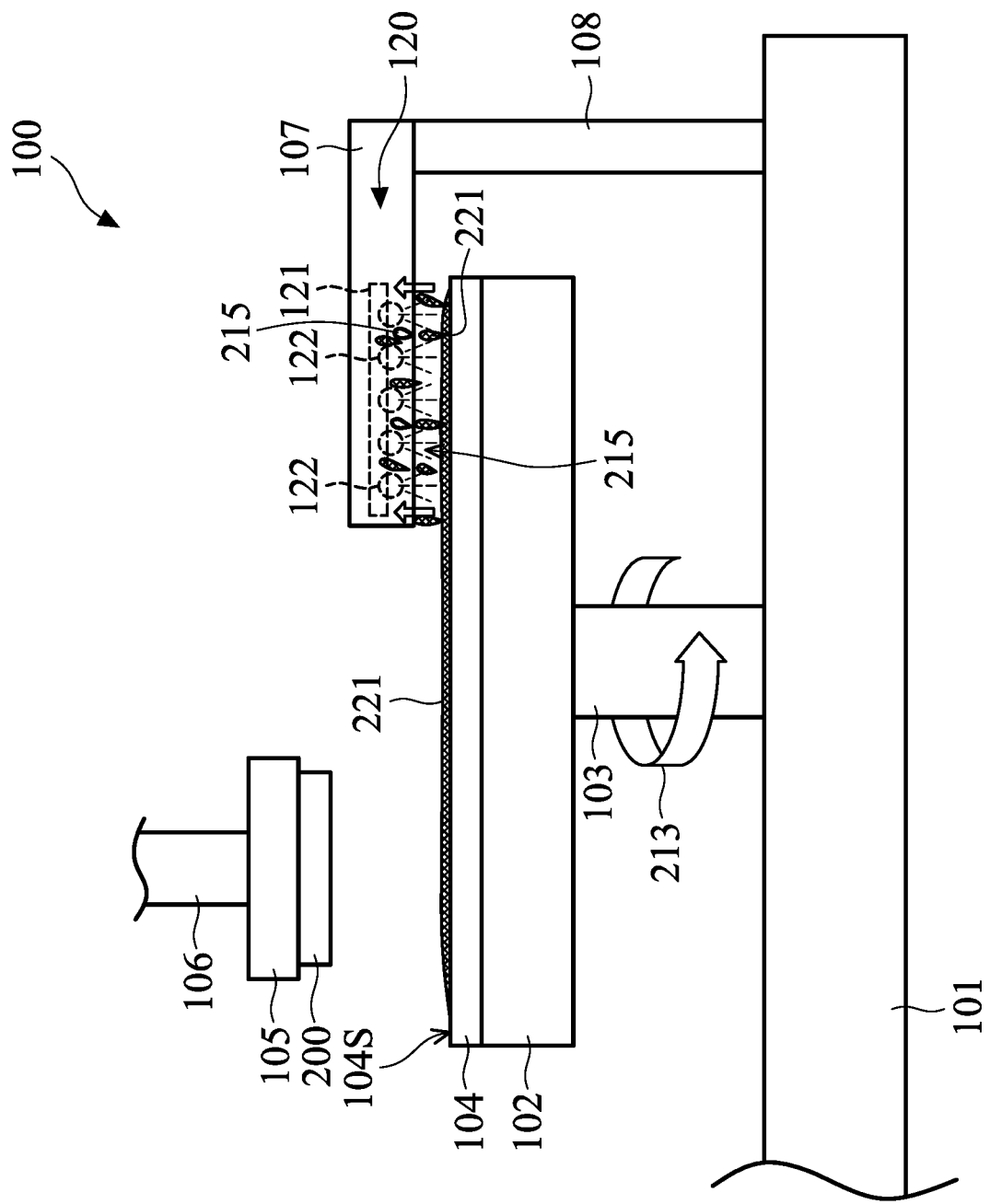

When the further polishing of the wafer 200 is finished, the supply assembly 110 of the slurry arm 107 is turned off. The dispensing nozzle 112 stops supplying the slurry 221. The polishing platen 102 continues to rotate. Afterwards, the wafer 200 is raised up and stops rotating. The cleaning assembly 120 of the slurry arm 107 is then turned on. The excess or waste slurry 221 left on the top surface 104S of the polishing pad 104 begins to be removed by the cleaning assembly 120, as shown in FIG. 2E.

Similarly, the spray nozzles 122 of the cleaning assembly 120 spray the rinsing agent 215 onto the polishing pad 104. The slurry 221 and/or other residues left on the polishing pad 104 are mixed with the rinsing agent 215 and are sucked along with the rinsing agent 215 into the cleaning assembly 120 through the opening 121. The slurry 221 and/or other residues may be delivered to a waste tank or a recycle tank. The slurry 221 and the slurry 211 may be delivered to the same tank or different tanks.

The cleaning assembly 120 is turned on until the top surface 104S of the polishing pad 104 becomes clean and has no slurry 221. The polishing platen 102 continues to rotate during the removal of the slurry 221. The slurry arm 107 may or may not be fixed during the removal of the slurry 221. After the removal of the slurry 221, the slurry arm 107 may or may not move to change its position.

Figure 2F:
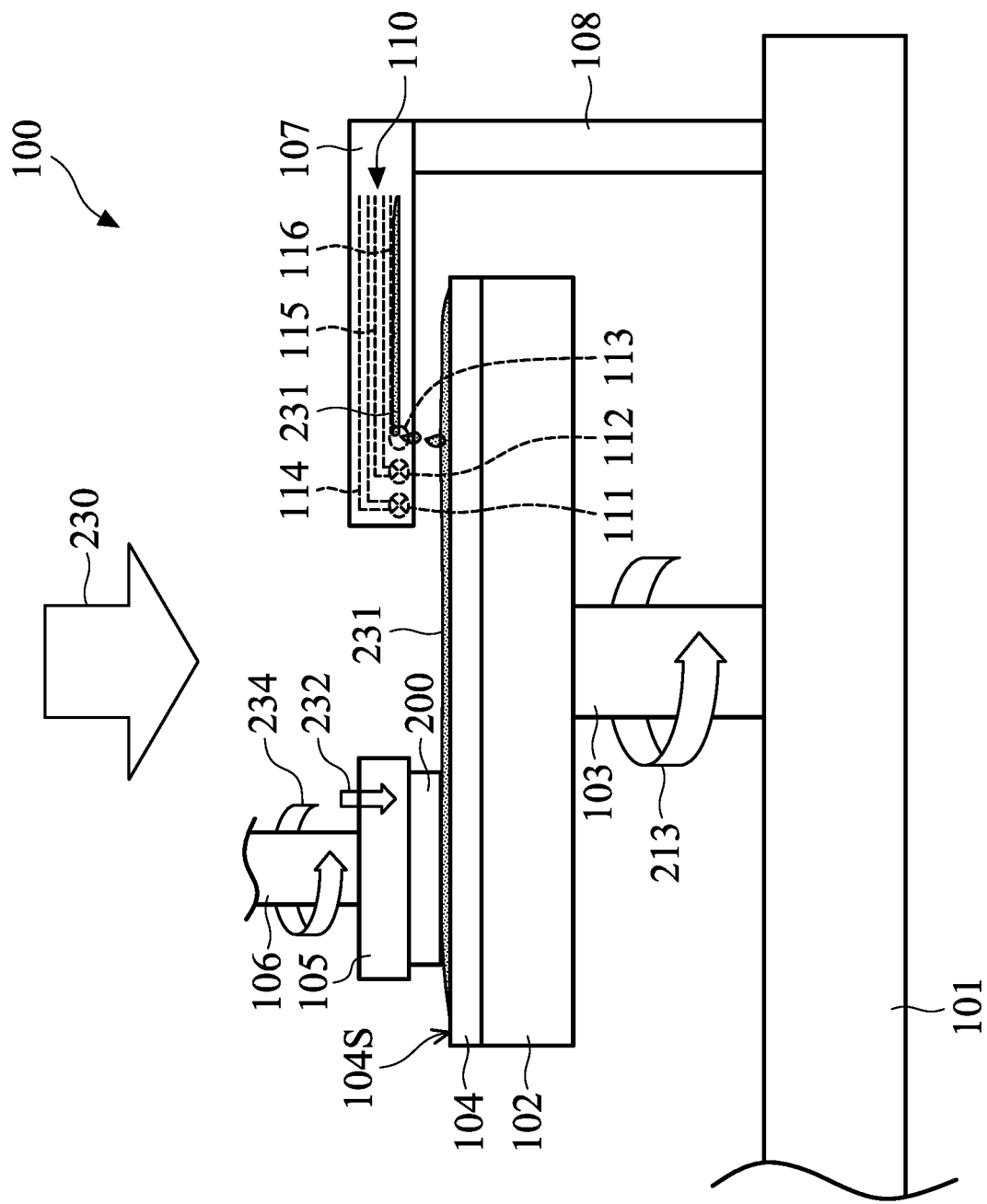
Figure 3D:
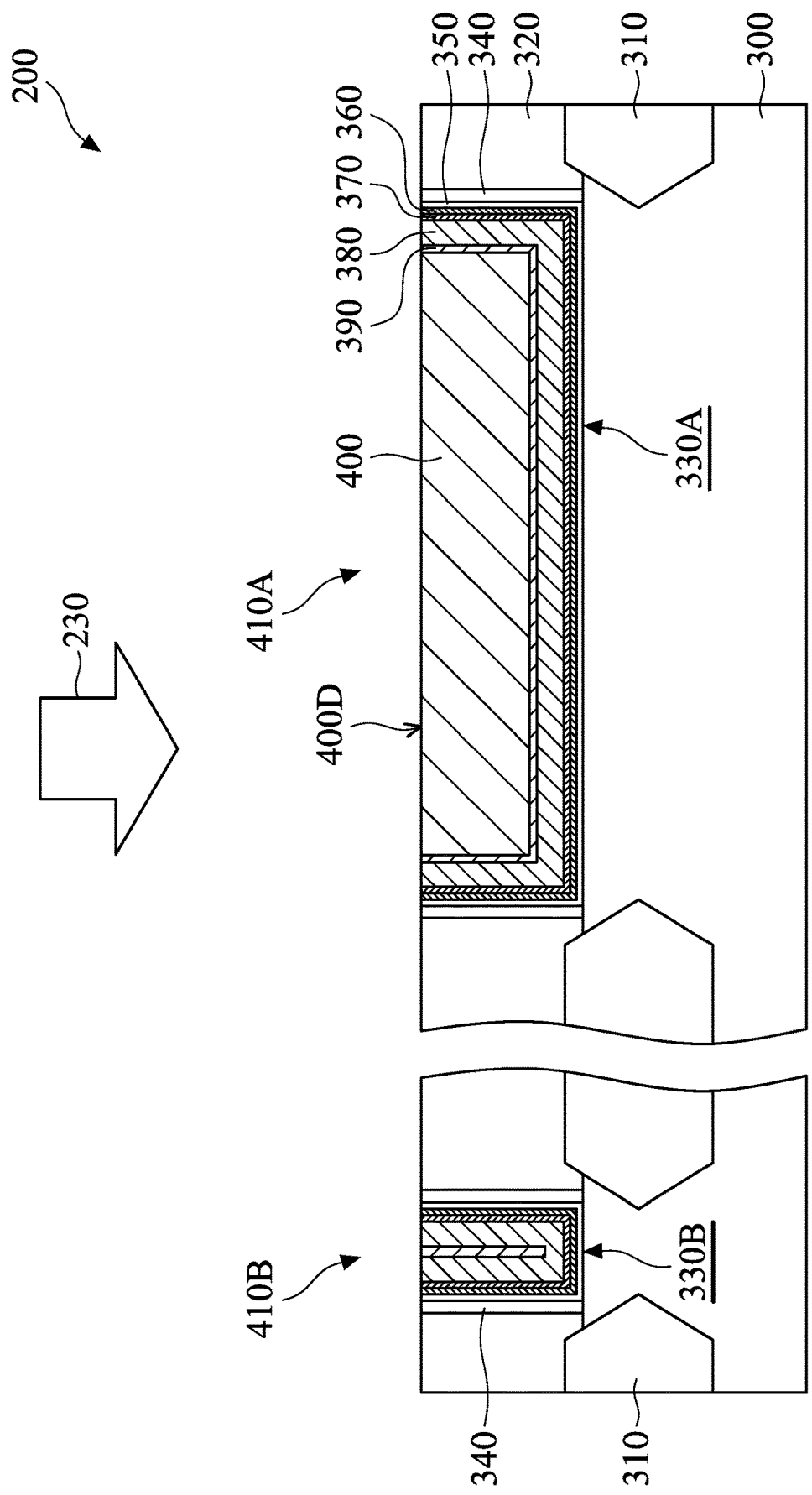

Afterwards, the polishing operation 230 is performed over the same polishing platen 102, as shown in FIG. 2F in accordance with some embodiments. The same polishing pad 104 may be used in the polishing operations 210, 220 and 230. The supply assembly 110 of the slurry arm 107 is turned on. Slurry 231 begins to flow through the delivery line 116 to the dispensing nozzle 113. The dispensing nozzle 113 continues to supply the slurry 231 onto the top surface 104S of the polishing pad 104. Subsequently, the wafer 200 is rotated and is pressed against the rotating polishing pad 104 by the polishing head 105. As a result, the rotating wafer 200 begins to be polished by the slurry 231 on the top surface 104S of the rotating polishing pad 104. For example, the top surface 400C of the metal filling layer 400 of the wafer 200 may be ground by the slurry 231. The glue layer 390, the blocking layer 380, the work function layer 370, the capping layer 360, the dielectric layer 350, the spacer elements 340 and/or the ILD layer 320 may be also ground by the slurry 231, as shown in FIG. 3D.

The polishing head 105 applies a pressure 232 to the wafer 200, as shown in FIG. 2F. The pressure 232 may be greater than, less than or substantially equal to the pressure 222, which is applied to the wafer 200 during the polishing operation 220. The wafer 200 rotates at a rotation rate 234 during the polishing operation 230. The rotation rate 234 may be greater than the rotation rate 213 of the polishing platen 102, but embodiments of the disclosure are not limited thereto. The rotation rate 234 may be greater than, less than or substantially equal to the rotation rate 224 of the wafer 200 during the polishing operation 220.

In some embodiments, the slurry 231 has a flow rate in a range from about 50 cc/sec. to about 600 cc/sec. The flow rate of the slurry 231 may be greater than, less than or substantially equal to the flow rate of the slurry 211 and/or the slurry 221. The dispensing nozzles 111 and 112 are off during the application of the slurry 231, as shown in FIG. 2F in accordance with some embodiments. No slurry flows or drops to the top surface 104S of the polishing pad 104 from the dispensing nozzles 111 and 112.

In some embodiments, the polishing material of the slurry 231 includes $Fe(NO_3)_3$, $H_2O_2$, another suitable polishing material, or a combination thereof. In some embodiments, the polishing material of the slurry 231 further includes abrasives, additives, or a combination thereof. The abrasives may include $Al_2O_3$ particles, $SiO_2$ particles, other suitable particles or a combination thereof. For example, the slurry 231 may be a slurry solution containing $Al_2O_3$ particles, $Fe(NO_3)_3$ and $H_2O_2$ or a slurry solution containing $SiO_2$ particles and $H_2O_2$.

In some embodiments, two or all of the slurry 231, the slurry 221 and the slurry 211 have different compositions. For example, the composition of the slurry 231 may be different from the composition of the slurry 221 but may be the same as the composition of the slurry 211. Alternatively, the composition of the slurry 231 may be different from the composition of the slurry 221 and the composition of the slurry 211. Two or all of the slurry 231, the slurry 221 and the slurry 211 may include different abrasives or the same abrasive.

In some embodiments, the slurry 231 has a concentration in a range from about 10% to about 30%. In some embodiments, two or all of the slurry 231, the slurry 221 and the slurry 211 have different concentrations. In some embodiments, the slurry 231 has a pH value in a range from about 2 to about 4, but embodiments of the disclosure are not limited thereto. In some embodiments, two or all of the slurry 231, the slurry 221 and the slurry 211 have different pH values.

In some embodiments, the slurry 231 has a polishing selectivity of a metal material to a dielectric layer in a range from about 0.5:1 to about 100:1. In some embodiments, the slurry 231 has a polishing selectivity of the metal filling layer 400 to the ILD layer 320 in a range from about 10:1 to about 100:1 or in a range from about 0.5:1 to about 2:1.

In accordance with some embodiments, the metal filling layer 400 of the wafer 200 is polished at a lower polishing rate during the polishing operation 230 than the polishing operations 210 and 220. In some embodiments, the slurry 231 has a lower polishing selectivity of a metal material to a dielectric layer than the slurry 221 and 211. However, many variations and/or modifications can be made to embodiments of the disclosure. In some other embodiments, the wafer 200 is polished at a higher polishing rate during the polishing operation 230 than the polishing operation 210 and/or the polishing operation 220. The slurry 231 may have a higher polishing selectivity of a metal material to a dielectric layer than the slurry 221 and/or the slurry 211.

In some embodiments, the slurry 231 has a relatively low polishing selectivity of the metal filling layer 400. The relatively low polishing selectivity may be less than about 40:1, but embodiments of the disclosure are not limited thereto. As a result, the metal filling layer 400, the glue layer 390, the blocking layer 380, the work function layer 370, the capping layer 360, the dielectric layer 350, the spacer elements 340 and/or the ILD layer 320 are all polished. The polishing operation 230 may be performed for a predetermined time. Alternatively, the polishing operation 230 may be stopped when an endpoint is achieved. The endpoint may be detected by monitoring friction force, image or temperature or by another applicable method. In some embodiments, the metal filling layer 400 has a substantially uniform and even top surface 400D, as shown in FIG. 3D. There is no dishing or erosion of the metal filling layer 400 and/or the ILD layer 320. In some other embodiments, the polishing operation 230 is not performed since the metal filling layer 400 has a substantially uniform and even top surface after the polishing operation 220.

Figure 2G:
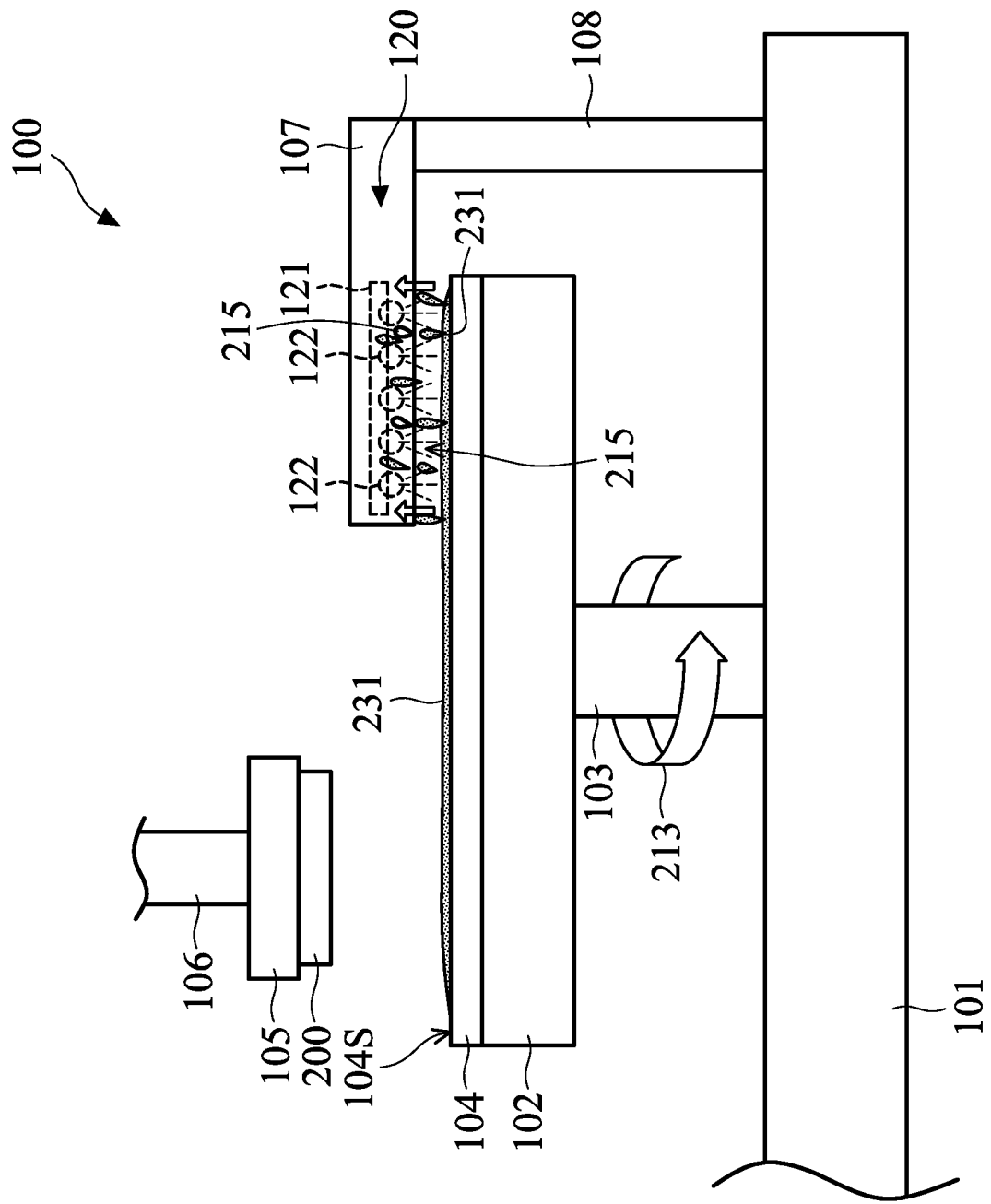

When the final polishing of the wafer 200 is finished, the supply assembly 110 of the slurry arm 107 is turned off. The dispensing nozzle 113 stops supplying the slurry 231. The polishing platen 102 continues to rotate. Afterwards, the wafer 200 is raised up and stops rotating. The cleaning assembly 120 of the slurry arm 107 is then turned on. The excess or waste slurry 231 left on the top surface 104S of the polishing pad 104 begins to be removed by the cleaning assembly 120, as shown in FIG. 2G.

Similarly, the spray nozzles 122 of the cleaning assembly 120 spray the rinsing agent 215 onto the polishing pad 104. The slurry 231 and/or other residues left on the polishing pad 104 are mixed with the rinsing agent 215 and are sucked along with the rinsing agent 215 into the cleaning assembly 120 through the opening 121. The slurry 231 and/or other residues may be delivered to a waste tank or a recycle tank. The slurry 231, the slurry 221 and the slurry 211 may be delivered to the same tank or different tanks.

The cleaning assembly 120 is turned on until the top surface 104S of the polishing pad 104 becomes clean and has no slurry 231. The polishing platen 102 continues to rotate during the removal of the slurry 231. The slurry arm 107 may or may not be fixed during the removal of the slurry 231.

After the polishing operation 230, the gate dielectric layer 350, the capping layer 360, the work function layer 370, the blocking layer 380, the glue layer 390, and the metal filling layer 400 remaining in the opening 330A together form a metal gate stack 410A, as shown in FIG. 3D. The gate dielectric layer 350, the capping layer 360, the work function layer 370, the blocking layer 380, and the glue layer 390 remaining in the opening 330B together form a metal gate stack 410B. The metal gate stack 410A has a greater width than the metal gate stack 410B. The processes described in FIGS. 2A-2G and FIGS. 3A-3D may also be applied even if the widths of the metal gate stacks 410A and 410B are substantially the same.

After the metal gate stacks 410A and 410B with a desired thickness are formed, the wafer 200 is moved out of the apparatus 100. Subsequently, various processes, such as back-end-of-line (BEOL) semiconductor fabrication processes, will be performed to form various features in and/or over the ILD layer 320. Some of the various features are electrically connected to the metal gate stacks 410A and 410B and the source/drain features 310. The various features may include contacts, interconnection lines, vias and other suitable features.

According to some embodiments of the disclosure, a polishing process for forming a semiconductor device structure includes multiple polishing operations 210, 220 and 230. The wafer 200 is gradually planarized at different rates with different slurries 211, 221 and 231 during various polishing operations 210, 220 and 230. Different slurries 211, 221 and 231 may have difference in material composition, abrasive, concentration, pH values, or a combination thereof. As a result, the slurry 211, the slurry 221 and the slurry 231 provide different polishing selectivities of a metal material to a dielectric layer. Multiple polishing operations 210, 220 and 230 with different polishing selectivities ensure that the polished wafer 200 has a flat surface (such as the top surface 400D shown in FIG. 3D) without damage.

The sequence of polishing operations with higher and lower polishing selectivities is not limited. For example, the wafer 200 may be initially ground with slurry 211 having either higher or lower polishing selectivity. The wafer 200 may be further ground with slurry 221 having either higher or lower polishing selectivity. Afterwards, the wafer 200 may be optionally ground with slurry 231 having either higher or lower polishing selectivity. The slurry 211, the slurry 221 and the slurry 231 may be selected to fine-tune the polishing selectivities or polishing rates so as to meet requirements. The uniformity control of the polishing process can be greatly improved due to different slurries 211, 221 and 231.

In accordance with some embodiments, the apparatus 100 for performing a polishing process includes the supply assembly 110. The supply assembly 110 includes independent dispensing nozzles 111, 112 and 113 to separately supply different slurries 211, 221 and 231 onto the polishing pad 104 over the polishing platen 102. As a result, there is no need to transfer the wafer 200 from the polishing platen 102 to additional polishing platen for different slurries.

In accordance with some embodiments, the apparatus 100 further includes the cleaning assembly 120. The excess or waste slurries 211, 221 and 231 and/or other residues left over the polishing platen 102 are separately removed by the cleaning assembly 120. More specifically, the slurry 211 left over the polishing platen 102 is removed by the cleaning assembly 120, and then the slurry 221 is supplied over the polishing platen 102 by the supply assembly 110. Subsequently, the slurry 221 left over the polishing platen 102 is removed by the cleaning assembly 120, and then the slurry 231 is supplied over the polishing platen 102 by the supply assembly 110. Due to the cleaning assembly 120, there is no need to transfer the wafer 200 from the polishing platen 102 to additional polishing platen between the polishing operations 210 and 220 and between the polishing operations 220 and 230.

According to some embodiments of the disclosure, the different polishing operations 210, 220 and 230 can be sequentially performed over the same polishing platen 102 (or the same polishing pad 104) in the same apparatus 100. As a result, the polishing process for forming a semiconductor device structure is performed in-situ for a shorter time. Performing this cyclic polishing process over the same polishing platen 102 provides many benefits. For example, the production efficiency is increased and the associated costs are lowered. Damage or contamination of the wafer 200, which may be induced during the transfer of the wafer 200 between different polishing operations 210, 220 and 230, are prevented. Therefore, the quality and reliability of the semiconductor device structure are enhanced.

Many variations and/or modifications can be made to embodiments of the disclosure. In some embodiments, as shown in FIGS. 3A-3D, a cyclic polishing process includes a first polishing operation with a high polishing selectivity, a second polishing operation with a high polishing selectivity, and a third polishing operation with a low polishing selectivity. However, in some other embodiments, a cyclic polishing process includes a first polishing operation with a high polishing selectivity, a second polishing operation with a low polishing selectivity, and a third polishing operation with a low polishing selectivity.

Figure 5A:
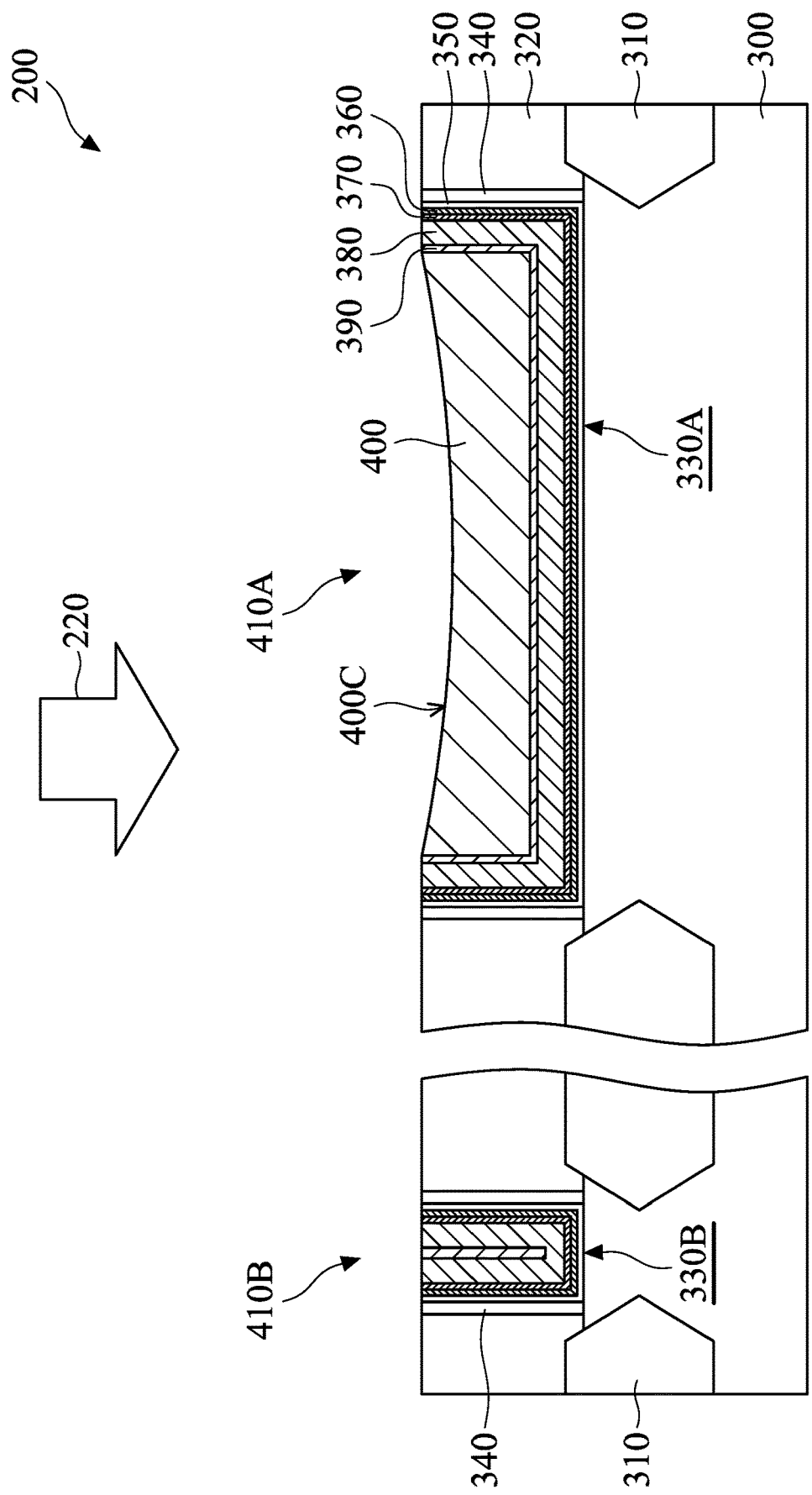
FIGS. 5A and 5B are cross-sectional views of various stages of a process for forming a semiconductor device structure, in accordance with some embodiments.
Figure 5B:
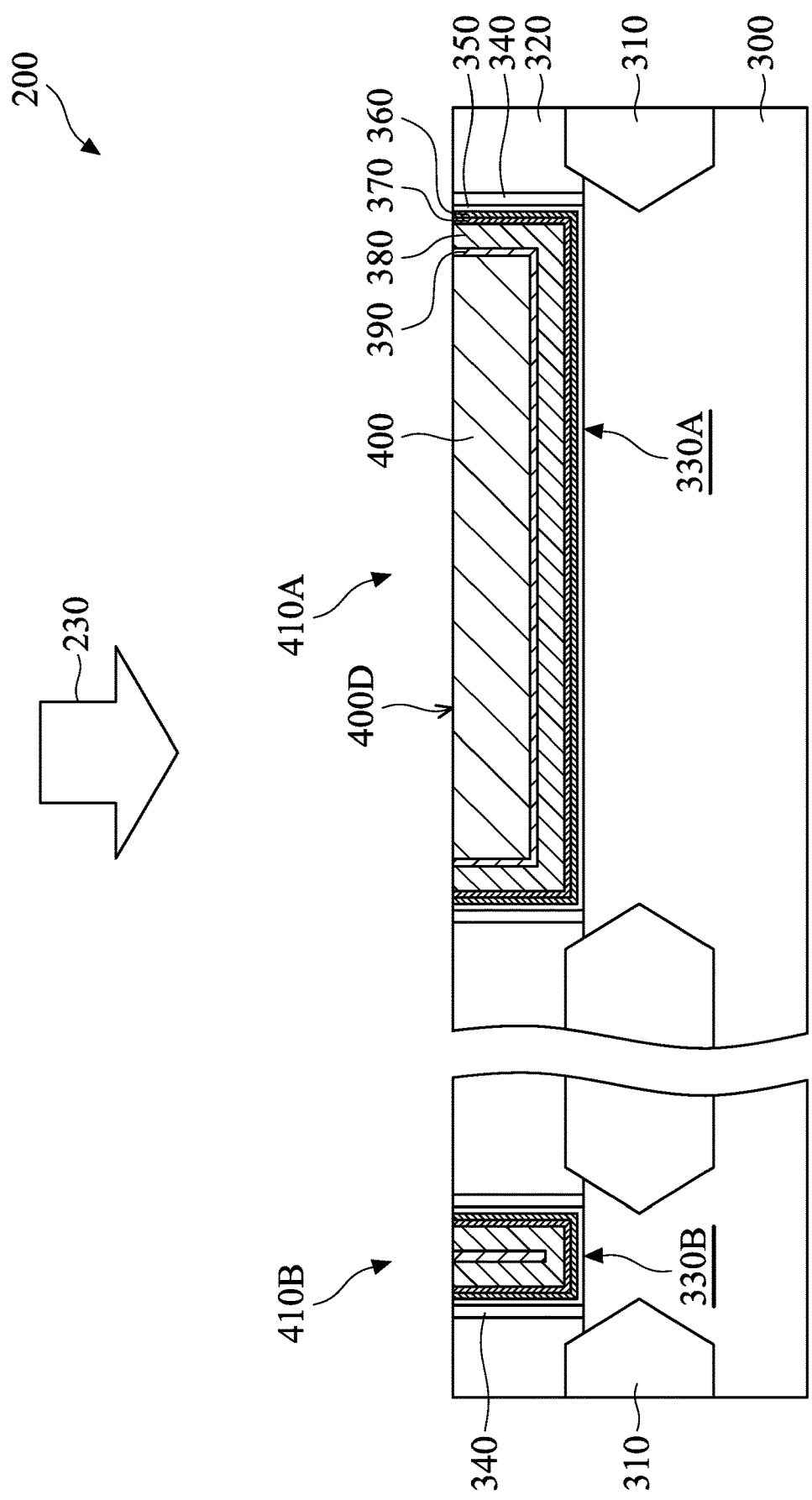

FIGS. 5A and 5B are cross-sectional views of various stages of a process for forming a semiconductor device structure, in accordance with some embodiments. The materials and/or formation methods of the structure shown in FIGS. 5A and 5B are the same as or similar to those of the structure shown in FIGS. 3A-3D, as illustrated in the aforementioned embodiments, and therefore are not repeated.

Processes similar to or the same as the embodiments illustrated in FIGS. 3A and 3B are performed over the wafer 200. In other words, the wafer 200 is initially polished using the polishing operation 210 shown in FIGS. 2A-2C. Afterwards, the wafer 200 remains in the apparatus 100, and the polishing operation 220 shown in FIGS. 2D and 2E is performed over the same polishing platen 102 to form the structure shown in FIG. 5A.

In accordance with some embodiments, the wafer 200 is polished at a lower polishing rate during the polishing operation 220 than the polishing operation 210. In some embodiments, the slurry 221 used in the polishing operation 220 has a lower polishing selectivity of a metal material to a dielectric layer than the slurry 211 used in the polishing operation 210. As a result, the metal filling layer 400, the glue layer 390, the blocking layer 380, the work function layer 370, the capping layer 360, the dielectric layer 350, the spacer elements 340 and/or the ILD layer 320 are all polished. The polishing operation 220 may be performed for a predetermined time or may be stopped when an endpoint is achieved. In some embodiments, the metal filling layer 400 has an uneven and recessed top surface 400C, as shown in FIG. 5A.

Similar to the embodiments illustrated in FIG. 3C, when the further polishing of the wafer 200 is finished, the supply assembly 110 of the slurry arm 107 is turned off. Afterwards, the excess or waste slurry 221 left on the top surface 104S of the polishing pad 104 is removed by the cleaning assembly 120, as shown in FIG. 2E. After the removal of the slurry 221, the slurry arm 107 may move to a better position from which to supply the slurry 231.

Similar to the embodiments illustrated in FIG. 3D, the polishing operation 230 is performed over the same polishing platen 102 to form the structure shown in FIG. 5B. In accordance with some embodiments, the wafer 200 is polished at a lower polishing rate during the polishing operation 230 than the polishing operation 220. In some embodiments, the slurry 231 used in the polishing operation 230 has a lower polishing selectivity of a metal material to a dielectric layer than the slurry 221 used in the polishing operation 220. As a result, the metal filling layer 400, the glue layer 390, the blocking layer 380, the work function layer 370, the capping layer 360, the dielectric layer 350, the spacer elements 340 and the ILD layer 320 are all polished. In some embodiments, the metal filling layer 400 has a substantially uniform and even top surface 400D, as shown in FIG. 5B. There is no dishing or erosion of the metal filling layer 400 and/or the ILD layer 320.

Many variations and/or modifications can be made to embodiments of the present disclosure. For example, although FIGS. 3A-3D, 5A and 5B show various stages of a polishing process for forming gate stacks, embodiments of the disclosure are not limited thereto. Some other embodiments of the disclosure shown in FIGS. 2A-2G can be applied to a planarization process for forming any suitable structure. For example, the polishing process shown in FIGS. 2A-2G may be used to thin and planarize a selectively deposited gap-fill material. Embodiments of the disclosure are suitable for small polishing amount without dishing or erosion of the polished material.

Embodiments of the disclosure can be applied to not only a semiconductor device structure with planar transistors but also a semiconductor device structure with fin field-effect transistors (FinFETs) or other suitable transistors. Embodiments of the disclosure are not limited and may be applied to fabrication processes for advanced technology generation or any suitable technology generation.

Embodiments of the disclosure provide methods for forming a semiconductor device structure. The semiconductor device structure includes a wafer or substrate to be polished. A polishing process includes multiple polishing operations to gradually planarize the wafer at different rates with different slurries. An apparatus for performing a polishing process includes a supply assembly and a cleaning assembly. The supply assembly includes independent nozzles to separately dispense different slurries onto a polishing pad over a polishing platen. Each kind of the excess or waste slurry and/or other residues left over the polishing platen will be removed by the cleaning assembly. There is no need to transfer the wafer from the polishing platen to an additional polishing platen for different slurries between various polishing operations. As a result, different polishing operations can be sequentially performed over the same polishing platen in the same apparatus. The fabrication time and cost of the polishing process for forming a semiconductor device structure is significantly reduced. Therefore, embodiments of the disclosure provide a faster and more efficient polishing process for forming a semiconductor device structure with better surface uniformity and good quality.

In accordance with some embodiments, a method for forming a semiconductor device structure is provided. The method includes providing a wafer over a polishing platen. The wafer includes a metal layer and a dielectric layer. The metal layer covers the dielectric layer and fills an opening of the dielectric layer. The method also includes polishing the wafer using a first operation to thin down the metal layer. The first operation has a first polishing selectivity of the metal layer to the dielectric layer. The method further includes polishing the wafer using a second operation to further thin down the metal layer until the dielectric layer is exposed. The second operation has a second polishing selectivity of the metal layer to the dielectric layer. The second polishing selectivity is different from the first polishing selectivity. The first operation and the second operation are performed in-situ on the polishing platen.

In accordance with some embodiments, a method for forming a semiconductor device structure is provided. The method includes providing a wafer over a polishing platen.

The method also includes supplying first slurry onto the polishing platen. The method further includes pressing the wafer against the polishing platen to polish the wafer with the first slurry at a first polishing rate. In addition, the method includes removing the first slurry from the polishing platen after the polishing of the wafer with the first slurry. The method also includes supplying second slurry onto the polishing platen after the removal of the first slurry. The method further includes pressing the wafer against the polishing platen to polish the wafer with the second slurry at a second polishing rate. The first polishing rate and the second polishing rate are different.

In accordance with some embodiments, a method for forming a semiconductor device structure is provided. The method includes holding a wafer with a polishing head over a polishing platen. The method also includes supplying first slurry onto the polishing platen using a slurry arm. The method further includes using the polishing head to press the wafer against the polishing platen to polish the wafer with the first slurry. In addition, the method includes removing the first slurry from the polishing platen. The method also includes supplying second slurry onto the polishing platen using the slurry arm after the removal of the first slurry. The method further includes using the polishing head to press the wafer against the polishing platen to polish the wafer with the second slurry.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   providing a wafer over a polishing platen with a polishing pad in an apparatus, wherein the wafer comprises a metal layer and a dielectric layer, and wherein the metal layer covers the dielectric layer and fills an opening of the dielectric layer;
   polishing the wafer using a first operation to thin down the metal layer with a first polishing rate, wherein a first slurry is supplied onto the polishing platen in the first operation by a first nozzle at a slurry arm and wherein the first slurry has a first polishing selectivity of a material of the metal layer to a material of the dielectric layer;
   polishing the wafer using a second operation to further thin down the metal layer with a second polishing rate, wherein the second polishing rate is lower than the first polishing rate, wherein a second slurry is supplied onto the polishing platen in the second operation by a second nozzle at a slurry arm, wherein the second slurry has a second polishing selectivity of the material of the metal layer to the material of the dielectric layer, and wherein the second polishing selectivity is lower than the first polishing selectivity; and
   polishing the wafer using a third operation to planarize the metal layer and the dielectric layer with a third polishing rate, wherein the third polishing rate is less than the first polishing rate, wherein a third slurry is supplied onto the polishing platen in the third operation by a third nozzle at the slurry arm, the third slurry has a third polishing selectivity of the material of the metal layer to the material of the dielectric layer, the third polishing selectivity is lower than the second polishing selectivity, wherein the first operation, the second operation and the third operation are sequentially performed on the polishing pad of the polishing platen, and wherein the wafer remains in the apparatus between the first operation, the second operation and the third operation.

2. The method for forming a semiconductor device structure as claimed in claim 1, wherein the first slurry and the second slurry comprise different abrasives.

3. The method for forming a semiconductor device structure as claimed in claim 1, wherein the first slurry and the second slurry have different pH values.

4. The method for forming a semiconductor device structure as claimed in claim 1, wherein the first operation comprises:
   supplying the first slurry onto the polishing platen using the first nozzle of the slurry arm;
   pressing the wafer against the polishing pad on the polishing platen to polish the wafer with the first slurry; and
   cleaning the polishing pad using a vacuum suction assembly of the slurry arm.

5. The method for forming a semiconductor device structure as claimed in claim 4, wherein the second operation comprises:
   supplying the second slurry onto the polishing platen using the second nozzle of the slurry arm, wherein the first nozzle is off during the supply of the second slurry;
   pressing the wafer against the polishing pad to polish the wafer with the second slurry; and
   cleaning the polishing pad using the vacuum suction assembly of the slurry arm.

6. The method for forming a semiconductor device structure as claimed in claim 1, wherein first slurry comprises $Al_2O_3$ particles, $Fe(NO_3)_3$ and $H_2O_2$.

7. The method for forming a semiconductor device structure as claimed in claim 1, wherein the first nozzle is located closer to a center of the polishing platen and the third nozzle is located closer to an edge of the polishing platen.

8. The method for forming a semiconductor device structure as claimed in claim 1, wherein the wafer further comprises
   a substrate;
   an interlayer dielectric layer over the substrate; and
   spacers on sidewalls of the interlayer dielectric layer;
   wherein the dielectric layer covers a top surface of the interlayer dielectric layer, a top surface of the substrate, and sidewalls of the spacers, and the metal layer is formed over the dielectric layer and overlaps the interlayer dielectric layer and the spacers before performing the first operation.

9. A method for forming a semiconductor device structure, comprising:
   providing a wafer over a polishing platen with a polishing pad in an apparatus, wherein the wafer comprises:
   a substrate;
   an interlayer dielectric layer having a trench formed over the substrate;
   a dielectric layer formed in the trench and covers a top surface of the interlayer dielectric layer;
   a glue layer formed over the gate dielectric layer; and
   a metal filling layer formed over the glue layer;

supplying a first slurry onto the polishing platen, wherein the first slurry has a first polishing rate toward the metal filling layer and a second polishing rate toward the glue layer, and the first polishing rate is greater than the second polishing rate;

pressing the wafer against the polishing pad of the polishing platen until the glue layer is exposed;

stopping the supply of the first slurry and removing the first slurry and the wafer from the polishing platen after the polishing of the wafer with the first slurry;

supplying a second slurry onto the polishing platen after the removal of the first slurry and the wafer, wherein the second slurry has a second polishing selectivity lower than a first polishing selectivity of the first slurry; and pressing the wafer against the polishing pad of the polishing platen to polish until the dielectric layer of the wafer is exposed, wherein the wafer remains in the apparatus between the wafer polished with the first slurry and the wafer polished with the second slurry.

10. The method for forming a semiconductor device structure as claimed in claim 9, wherein the first slurry is supplied by a first dispensing nozzle, and the second slurry is supplied by a second dispensing nozzle, and wherein the first dispensing nozzle and the second dispensing nozzle are connected to separate delivery lines.

11. The method for forming a semiconductor device structure as claimed in claim 9, wherein the wafer rotates at a first rotation rate during the polishing of the wafer with the first slurry, and the wafer rotates at a second rotation rate during the polishing of the wafer with the second slurry, and wherein the first rotation rate and the second rotation rate are different.

12. The method for forming a semiconductor device structure as claimed in claim 9, wherein the removal of the first slurry comprises:

using a cleaning assembly in a slurry arm to spray a rinsing agent on the polishing platen by spray nozzles of the cleaning assembly;

sucking the first slurry and the rinsing agent through an opening of the cleaning assembly, wherein the first slurry is applied to the polishing platen by a dispensing nozzle of a supply assembly in the slurry arm, and the dispensing nozzle and the spray nozzles are arranged at opposite sides of the slurry arm.

13. A method for forming a semiconductor device structure, comprising:

holding a wafer with a polishing head over a polishing platen with a polishing pad in an apparatus, wherein the wafer comprises a metal filling layer and an interlayer dielectric layer that are to be polished, wherein the metal filling layer covers the interlayer dielectric layer;

supplying a first slurry onto the polishing platen using a slurry arm, wherein the first slurry has a first polishing selectivity of a material of the metal filling layer to a material of the interlayer dielectric layer;

using the polishing head to press the wafer against the polishing pad of the polishing platen to polish the metal filling layer of the wafer with the first slurry;

stopping the supply of the first slurry, mixing the first slurry over the polishing platen with a first rinsing agent from the slurry arm, sucking a mixture including the first slurry and the first rinsing agent from the polishing platen into a recycle tank by the slurry arm, and removing the wafer from the polishing platen;

supplying a second slurry onto the polishing platen using the slurry arm after the removal of the first slurry and the wafer, wherein the second slurry has a second polishing selectivity of the material of the metal filling layer to the material of the interlayer dielectric layer and wherein the second polishing selectivity is in a range from about 0.5:1 to 100:1; and using the polishing head to press the wafer against the polishing pad of the polishing platen to polish the metal filling layer of the wafer with the second slurry;

stopping the supply of the second slurry, mixing the second slurry over the polishing platen with a second rinsing agent from the slurry arm, sucking a mixture including the second slurry and the second rinsing agent from the polishing platen into the recycle tank by the slurry arm;

polishing the wafer by supplying a third slurry onto the polishing platen using the slurry arm until the interlayer dielectric layer of the wafer is exposed, wherein the wafer remains in the apparatus between the wafer polished with the first slurry and the wafer polished with the second slurry.

14. The method for forming a semiconductor device structure as claimed in claim 13, wherein the first slurry is different from the second slurry, and no first slurry is supplied onto the polishing platen during the supply of the second slurry.

15. The method for forming a semiconductor device structure as claimed in claim 13, wherein the slurry arm comprises a first delivery line for the supply of the first slurry and a second delivery line for the supply of the second slurry, and wherein the first slurry is different from the second slurry, and the first delivery line is independent from the second delivery line.

16. The method for forming a semiconductor device structure as claimed in claim 15, wherein the slurry arm further comprises a cleaning assembly, and the first slurry is sucked through an opening of the cleaning assembly during the removal of the first slurry.

17. The method for forming a semiconductor device structure as claimed in claim 13, further comprising:

moving the slurry arm with respect to the polishing head after the removal of the first slurry and before the supply of the second slurry.

18. The method for forming a semiconductor device structure as claimed in claim 13, wherein the polishing platen rotates during the polishing of the wafer with the first slurry, and wherein the polishing platen continues to rotate during the removal of the first slurry and during the polishing of the wafer with the second slurry.

19. The method for forming a semiconductor device structure as claimed in claim 16, wherein the first rinsing agent and the second rinsing agent are supplied by spray nozzles of the cleaning assembly, and spray nozzles are at two opposite sides of the opening and are arranged along the opening.

20. The method for forming a semiconductor device structure as claimed in claim 16, wherein the opening is a ring-shaped opening.

* * * * *